(12) United States Patent
Chan et al.

(10) Patent No.: US 11,531,404 B2
(45) Date of Patent: Dec. 20, 2022

(54) KEYBOARD COMPOSITE ELECTRODE MODULE AND LUMINOUS TOUCH KEYBOARD THEREWITH

(71) Applicant: Darfon Electronics Corp., Taoyuan (TW)

(72) Inventors: Chin-Lung Chan, Taoyuan (TW); Wei-Yan You, Taoyuan (TW); Po-Yueh Chou, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 0 days.

(21) Appl. No.: 17/316,762

(22) Filed: May 11, 2021

(65) Prior Publication Data

US 2021/0349548 A1 Nov. 11, 2021

Related U.S. Application Data

(60) Provisional application No. 63/105,911, filed on Oct. 27, 2020, provisional application No. 63/022,589, filed on May 11, 2020.

(30) Foreign Application Priority Data

Mar. 24, 2021 (TW) .................................. 110110696

(51) Int. Cl.
*G06F 3/02* (2006.01)
*G06F 3/044* (2006.01)
*H03K 17/96* (2006.01)

(52) U.S. Cl.
CPC .......... *G06F 3/0213* (2013.01); *G06F 3/0446* (2019.05); *H03K 17/9622* (2013.01); *H03K 2217/960785* (2013.01)

(58) Field of Classification Search
None
See application file for complete search history.

(56) References Cited

U.S. PATENT DOCUMENTS

| | | | |
|---|---|---|---|
| 4,017,848 | A | 4/1977 | Tannas, Jr. |
| 4,246,452 | A | 1/1981 | Chandler |
| (Continued) | | | |

FOREIGN PATENT DOCUMENTS

| | | |
|---|---|---|
| CN | 101174511 A | 5/2008 |
| CN | 201417426 Y | 3/2010 |
| (Continued) | | |

OTHER PUBLICATIONS

TW Office Action dated May 6, 2022 in Taiwan application No. 110110696.
(Continued)

*Primary Examiner* — Matthew Yeung
(74) *Attorney, Agent, or Firm* — McClure, Qualey & Rodack, LLP

(57) ABSTRACT

A luminous touch keyboard includes a baseplate, a plurality of keycaps, a plurality of support mechanisms connected between the baseplate and the keycaps, and a keyboard composite electrode module disposed between the baseplate and the keycaps and configured to sense a non-pressing movement over the keycaps and to provide light emitting through the keycaps. The support mechanism supports the keycap to move relative to the baseplate and the keyboard composite electrode module. The keyboard composite electrode module includes a light source circuit and a plurality of electrode matrices arranged along a first direction and a second direction. Two of the electrode matrices adjacent in the second direction are mis-aligned. The light source circuit includes a plurality of light sources disposed in the plurality of electrode matrices in a one-to-one manner, and the
(Continued)

position of the light source in the electrode matrix is correspondingly the same.

19 Claims, 28 Drawing Sheets

(56) References Cited

U.S. PATENT DOCUMENTS

| | | | |
|---|---|---|---|
| 6,204,839 B1 | 3/2001 | Mato, Jr. | |
| 6,924,789 B2 | 8/2005 | Bick | |
| 7,944,437 B2 | 5/2011 | Imamura | |
| 8,059,015 B2 | 11/2011 | Hua et al. | |
| 8,378,857 B2* | 2/2013 | Pance | G06F 3/0202 |
| | | | 341/28 |
| 8,858,003 B2 | 10/2014 | Porter et al. | |
| 9,229,597 B2 | 1/2016 | Oraw | |
| 9,367,151 B2 | 6/2016 | McKillop et al. | |
| 9,612,666 B2 | 4/2017 | Cho | |
| 9,747,026 B1 | 8/2017 | Hua et al. | |
| 10,019,103 B2 | 7/2018 | Gupta et al. | |
| 10,289,238 B2 | 5/2019 | Lee et al. | |
| 10,289,252 B2 | 5/2019 | Cok | |
| 10,585,493 B2* | 3/2020 | Elias | G06F 3/0202 |
| 10,754,440 B2 | 8/2020 | Hsu et al. | |
| 2004/0206615 A1* | 10/2004 | Aisenbrey | H01H 13/785 |
| | | | 200/262 |
| 2010/0032198 A1 | 2/2010 | Inoue | |
| 2012/0306756 A1 | 12/2012 | Lin et al. | |
| 2013/0135211 A1 | 5/2013 | Chiang et al. | |
| 2018/0217668 A1 | 8/2018 | Ligtenberg et al. | |
| 2019/0155451 A1 | 5/2019 | Yeh et al. | |
| 2020/0103981 A1 | 4/2020 | Hsu et al. | |
| 2020/0142501 A1* | 5/2020 | Wang | G06F 3/0202 |

FOREIGN PATENT DOCUMENTS

| | | |
|---|---|---|
| CN | 102609100 B | 7/2012 |
| CN | 202307638 U | 7/2012 |
| CN | 202948402 U | 5/2013 |
| CN | 110968200 A | 4/2020 |
| EP | 3477438 A1 | 5/2019 |
| TW | I521557 B | 2/2016 |
| TW | I545494 B | 8/2016 |
| TW | M548296 U | 9/2017 |
| TW | 201926009 A | 7/2019 |

OTHER PUBLICATIONS

TW Office Action dated Jan. 27, 2022 in Taiwan application (No. 109144152).

* cited by examiner

KEYBOARD COMPOSITE ELECTRODE MODULE AND LUMINOUS TOUCH KEYBOARD THEREWITH

BACKGROUND OF THE INVENTION

1. Field of the Invention

The invention generally relates to a luminous touch keyboard. Particularly, the invention relates to a luminous touch keyboard, which integrates a touch sensing circuit and a light source circuit in a keyboard composite electrode module, and a keyboard composite electrode module thereof.

2. Description of the Prior Art

The keyboard is mainly used to input text signals into a computer system. After years of evolution and integration, the layout of the keyswitches on the keyboard has gradually formed an international standard specification.

On the other hand, the touch panel provides users with different operation options and inputs touch signals into the computer system in a single-touch or multi-touch manner. At present, the touch function has been successfully integrated into the screen. However, attempts to integrate the touch function on the physical keyboard without using the touch panel have never been able to achieve satisfactory results in terms of operation, function, and structure; especially, intending to integrate the touch function into the luminous keyboard is more difficult.

SUMMARY OF THE INVENTION

It is an object of the invention to provide a keyboard composite electrode module, which is integrated into the keyboard structure to sense a non-pressing movement of objects on the keyswitches and to provide light emitting through the keycaps to facilitate the operation of the keyboard in a dim environment.

In an embodiment, the invention provides a keyboard composite electrode module including a bearing structure, a light source circuit, and a touch sensing circuit. The light source circuit is disposed on the bearing structure and includes a plurality of light sources. The touch sensing circuit is disposed on the electrode bearing structure and includes a plurality of first electrode strings and a plurality of second electrode strings, wherein the plurality of first electrode strings extend along a first direction and are arranged at intervals in a second direction, and the plurality of second electrode strings extend along the second direction and are arranged at intervals in the first direction to be interlaced with the plurality of first electrode strings. A plurality of key projection zones are defined on the keyboard composite electrode module. Each of the key projection zones covers a same key-face electrode pattern, and the key-face electrode pattern includes one of the plurality of light sources.

In an embodiment, the plurality of first electrode strings and the plurality of second electrode strings are interlaced to form a plurality of electrode matrices arranged along the first direction and the second direction. Two of the electrode matrices adjacent in the second direction are mis-aligned. Each of the electrode matrices corresponds to one of the plurality of key projection zones, and in each of the key projection zones, a position of the light source in the electrode matrix is correspondingly the same.

In an embodiment, a plurality of key-gap projections are defined on the plurality of electrode matrices. Corresponding to each of the plurality of key projection zones, the key-gap projection surrounds the corresponding key projection zone, and each of the key-gap projection covers a same key-gap electrode pattern.

In an embodiment, the light source circuit includes a plurality of light source wirings for electrically coupling to the plurality of light sources, and the plurality of light source wirings extend along the first direction and are arranged at intervals in the second direction, such that the plurality of light source wirings are arranged at intervals with the plurality of first electrode strings and interlaced with the plurality of second electrode strings.

In an embodiment, the bearing structure includes a first substrate, wherein the light source circuit, the plurality of first electrode strings, and the plurality of second electrode strings are disposed on a same surface of the first substrate, and at locations where the second electrode strings are interlaced with the light source circuit and the plurality of first electrode strings, an insulation layer is disposed between the plurality of second electrode strings and the light source circuit and between the plurality of second electrode strings and the plurality of first electrode strings.

In an embodiment, at the locations where the second electrode strings are interlaced with the light source circuit and the plurality of first electrode strings, the light source circuit or the plurality of first electrode strings are located between the plurality of second electrode strings and the first substrate.

In an embodiment, the key-face electrode pattern further includes a first contact portion and a second contact portion, wherein the first contact portion and the second contact portion extend respectively from one of the first electrode strings and one of the second electrode strings. The first contact portion and the second contact portion are conducted via a conductive coupling portion.

In an embodiment, the bearing structure further includes a second substrate disposed opposite to the first substrate and a spacer layer sandwiched between the first substrate and the second substrate. The key-face electrode pattern includes the conductive coupling portion. The conductive coupling portion is formed on the second substrate. The spacer layer has a through hole. The first contact portion and the second contact portion are disposed corresponding to the through hole and opposite to the conductive coupling portion. A portion of the keyboard composite electrode module corresponding to the first contact portion and the second contact portion is pressable, such that the conductive coupling portion electrically couples to the first contact portion and the second contact portion via the through hole when the portion is pressed.

In an embodiment, the conductive coupling portion includes a contact surface. The first contact portion and the second contact portion respectively includes at least a contact line. The first contact portion and the second contact portion are electrically connected to each other when the contact surface comes in contact with the contact lines.

In an embodiment, the bearing structure includes a first substrate, a second substrate deposed opposite to the first substrate, and a spacer layer sandwiched between the first substrate and the second substrate. The plurality of first electrode strings and the light source circuit are formed on a first upper surface of the first substrate, and the plurality of second electrode strings are formed on a lower surface of the second substrate.

In an embodiment, the key-face electrode pattern further includes a first contact portion and a second contact portion, wherein the first contact portion and the second contact portion respectively extend from one of the first electrode strings and one of the second electrode strings. The spacer layer has a through hole. The first contact portion and the second contact portion are disposed opposite to each other with respect to the through hole. A portion of the keyboard composite electrode module corresponding to the first contact portion and the second contact portion is pressable, such that the first contact portion and the second contact portion come in contact with each other via the through hole when the portion is pressed.

In an embodiment, the first contact portion and the second contact portion respectively includes at least a contact line. The first contact portion and the second contact portion are electrically connected to each other when the contact lines come in contact with each other.

In an embodiment, the contact line is a straight line, a curve, a loop, a rectangle, a serration, or any combination thereof.

In an embodiment, the bearing structure includes a substrate; the light source circuit and the touch sensing circuit are disposed on opposite surfaces of the substrate. Light provided by the plurality of light sources emit through the substrate from a portion of the substrate where the plurality of first electrode strings and the plurality of second electrode strings are not disposed.

In an embodiment, each of the first electrode strings includes a plurality of first main sections and a plurality of first branch sections. The plurality of main sections extend along the first direction and are linearly connected in series. The plurality of first branch sections are arranged at intervals in the first direction and protrude from the plurality of first main sections along the second direction.

In an embodiment, each of the second electrode strings includes a plurality of second main sections and a plurality of second branch sections. The plurality of second main sections extend separately along the second direction and are staggered and arranged in two rows in the first direction. The plurality of second branch sections are arranged at intervals along the second direction and connect the adjacent second main sections in the two rows along the first direction.

In an embodiment, the key-face electrode pattern has a same layout of openings.

In another embodiment, the invention provides a keyboard composite electrode module including a plurality of electrode matrices and a light source circuit, wherein the plurality of electrode matrices are consecutively arranged along a first direction and a second direction. Two of the electrode matrices adjacent in the second direction are shifted from and mis-aligned with each other along the second direction. At least two of the electrode matrices mis-aligned in the second direction are identical to each other. Each of the electrode matrices includes a plurality of sections of first electrode strings and a plurality of sections of second electrode strings interlaced with the plurality of sections of first electrode strings. The light source circuit includes a plurality of light source wirings and a plurality of light sources disposed on the plurality of light source wirings. The plurality of light sources are disposed in the plurality of electrode matrices in a one-to-one manner.

In an embodiment, the position of the light source in each of the electrode matrices is correspondingly the same.

In still another embodiment, the invention provides a keyboard composite electrode module including a plurality of electrode matrices and a light source circuit, wherein the plurality of electrode matrices correspond to a plurality of key projection zones in a one-to-one manner. The plurality of electrode matrices are arranged along a first direction and a second direction. At least two of the electrode matrices are mis-aligned in the second direction and identical to each other. The electrode matrices include a plurality of electrodes arranged at a same electrode gap. The size of the electrode in the second direction is a function of a key pitch of the key projection zones, the electrode gap, and a number of rows or columns of the electrodes covered by the key pitch. The light source circuit includes a plurality of light sources disposed in the plurality of electrode matrices in a one-to-one manner. The position of the light source in each of the electrode matrices is correspondingly the same.

In an embodiment, the at least two of the electrode matrices mis-aligned in the second direction have a same layout of openings, and at least one of the openings is located in the electrode matrix.

In another embodiment, the invention provides a luminous touch keyboard including a baseplate, a plurality of keycaps disposed over the baseplate, a keyboard composite electrode module as discussed above, and a plurality of support mechanisms, wherein the keyboard composite electrode module is disposed between the baseplate and the plurality of keycaps and configured to sense a non-pressing movement over the keycaps and to provide light emitting through the plurality of keycaps. The plurality of support mechanisms are correspondingly connected between the baseplate and the plurality of keycaps and configured to support the keycaps to be movable relative to the baseplate and the keyboard composite electrode module.

In an embodiment, the keyboard composite electrode module further includes a switch circuit including a plurality of switch units disposed corresponding to the plurality of keycaps, respectively. Each of the plurality of switch units is formed by one of the first electrode strings and one of the second electrode strings, and is triggered via a conductive coupling portion to generate a triggering signal.

In an embodiment, the luminous touch keyboard of the invention further includes a plurality of restoring members disposed between the baseplate and the plurality of keycaps, wherein the conductive coupling portion is correspondingly disposed on the restoring member.

In an embodiment, the keyboard composite electrode module includes the conductive coupling portion. The conductive coupling portion is disposed opposite to and spaced apart from the corresponding switch unit. When the keycap is pressed, the keycap drives the keyboard composite electrode module to deform, such that the switch unit is triggered by the conductive coupling portion.

Compared with the prior art, the luminous touch keyboard and the keyboard composite electrode module of the invention integrate the touch sensing circuit and the light source circuit in the same electrode module, which not only improves the operability and functionality of the keyboard, but also benefits to the thinning of the keyboard. Furthermore, even when the luminous touch keyboard and the keyboard composite electrode module of the invention integrate the light source circuit, each of the key projection zones still can cover the same electrode pattern including the light source, thus reducing the complexity of electrode layout design, improving the regularity of electrode sensing performance, and in turn improving the accuracy of touch operation of the touch keyboard. In addition, the thickness of the circuit layer of the luminous touch keyboard can be effectively reduced by a single-layer integrated design that forms the touch sensing electrode strings (used to sense the non-pressing movement on the keys to generate touch signals), the trigger electrodes (conducted to generate text signals by the mechanical movement of the key), and the light source circuit (used to provide the luminous effect of light emitted through the keycaps) on the keyboard composite electrode module, which benefits to the thinning design of the luminous touch keyboard.

BRIEF DESCRIPTION OF THE DRAWINGS

FIGS. 7A to 7C are schematic views of the keyboard composite electrode module of FIG. 6, wherein FIG. 7A shows that the touch sensing circuit and the light source circuit are disposed on the first substrate of the bearing structure, and FIG. 7B shows the spacer layer of the bearing structure, and FIG. 7C shows that the conductive coupling portion is disposed on the second substrate of the bearing structure.

FIGS. 9A to 9C are schematic views of the keyboard composite electrode module of FIG. 8, wherein FIG. 9A shows that the first electrode strings of the touch sensing circuit and the light source circuit are disposed on the first substrate of the bearing structure, and FIG. 9B shows the spacer layer of the bearing structure, and FIG. 9C shows that the second electrode strings of the touch sensing circuit are disposed on the second substrate of the bearing structure.

DETAILED DESCRIPTION OF THE PREFERRED EMBODIMENT

Figure 1A:
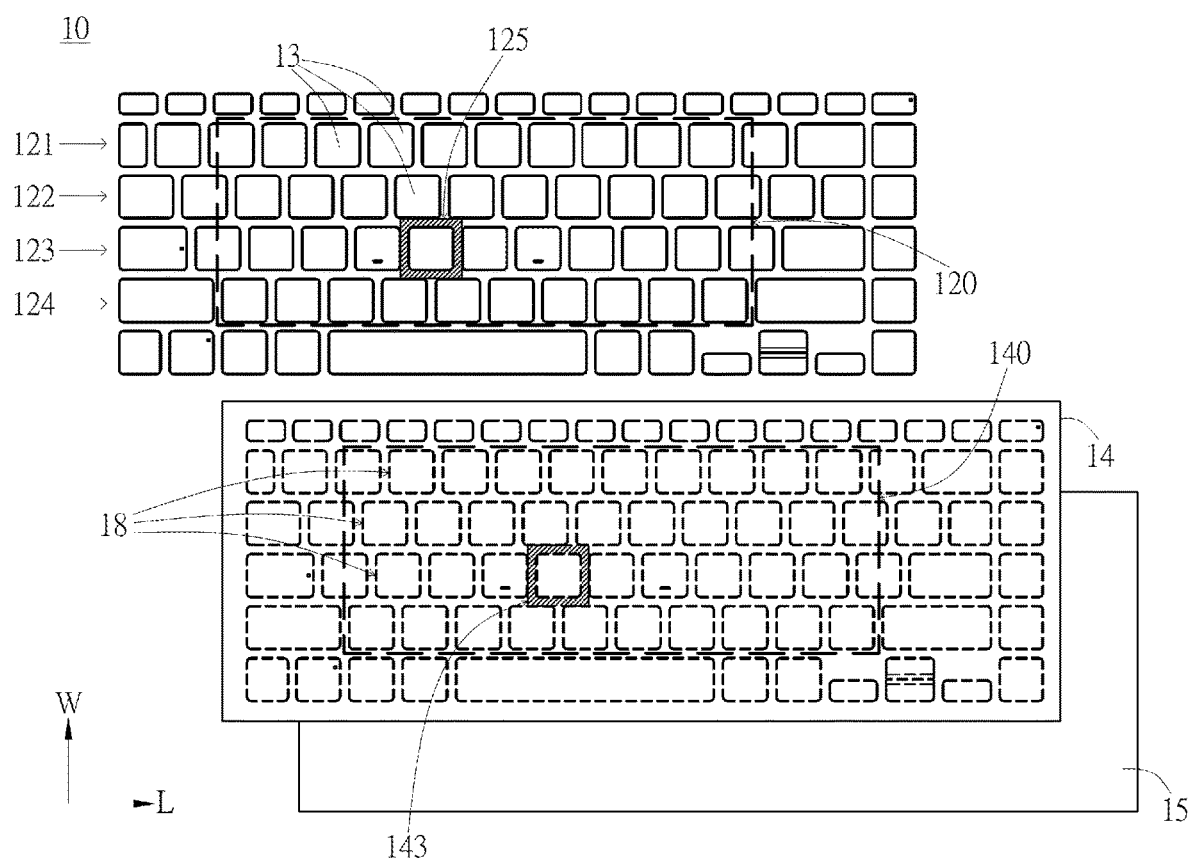
FIG. 1A is an exploded schematic view of some components of the luminous touch keyboard according to the first embodiment of the invention.

The invention relates to how to reliably integrate a touch sensing circuit, a light source circuit into a keyboard, so as to provide a luminous touch keyboard that can sense the non-pressing movement of objects on a plurality of keycaps and provide light emitted through the plurality of keycaps. In an ideal state, for a keyboard with a regular matrix arrangement of equal size, the membrane circuit is usually configured with a pair of trigger electrodes at the position corresponding to the triggering member of each keyswitch. When the touch sensing circuit layer (X-Y axis electrodes arranged in a regular matrix) is stacked between the keyswitch components, the trigger electrodes of the keyswitch can be contacted and conducted by, for example, a rubber dome when the keycap is pressed, thereby generating text signals (signal of inputting letter/number/symbol) to perform the corresponding input function. When the user is not performing the pressing operation, the touch sensing circuit layer can sense the capacitance value induced by the user's non-pressing movement (such as single/multi-contact/click/continuous movement, etc.) on the surface of the keycap, thereby generating a touch signal to perform the corresponding touch function. When the touch keyboard needs to have the luminous function, a light source circuit can be used to provide a light source corresponding to each keyswitch to form a luminous touch keyboard. Therefore, integrating the touch sensing circuit, the light source circuit, and the membrane switch can benefit the thinning design of the luminous touch keyboard.

However, for keyboards and keys that are not arranged in a regular matrix of equal size, the international standard layout adopts a staggered arrangement design. For example, the over forty text keyswitch that account for the largest number, i.e., the square keys or the alphanumeric keys are usually keyswitches that can input English letters/numbers and some symbols. When the touch sensing circuit layer with electrodes arranged in a regular matrix is directly stacked on the keyboard structure, the X-Y axis electrode pattern corresponding to the projection zone of each text keyswitch is in principle different. In other words, text keyswitches with equal size but staggered arrangement will correspond to different X-Y axis electrode matrix patterns. Since the distribution area of the text keyswitches is the area with the highest frequency of typing input on the keyboard, and is also the area with the most opportunity to switch to the touch function, different XY axis electrode matrix patterns will make the group of touch events of each text key area present different groups of the capacitance sensing data.

In addition to the issues of different key sizes and staggered arrangement of the keyswitches, there are other factors that lead to poor keyboard touch sensing performance, and the invention identifies several of them. One is that the height of the touch object (such as the finger shown in FIG. 1B or a stylus) moving in the touch area (covering multiple keyswitches and the gap therebetween, such as the touch area 120 shown in FIG. 1A) is different, and the medium between the touch object and the touch electrode layer is different. For example, in FIG. 1B, when the object O moves from the key-face to the key-gap, the object O is prone to fall into the key-gap (such as the key-gap layout 125), so that the object O will have a height difference and a medium difference with the touch electrodes (such as the key-gap electrode patterns Mg1, Mg2 and the key-face electrode patterns Mf1, Mf2, Mf3 on the keyboard composite electrode module 14 in the following embodiments) at the key-face and at the key-gap, causing the high variability of touch sensing data, and difficult to adjust, key by key, the threshold value (such as a certain capacitance value) that triggers the touch signal. After all, the key-gap mainly includes medium of air (and an additional keyboard frame, if exists), and under the key-face, multiple key components are disposed to allow the keycap to move up and down. Another one is the openings on the touch electrode layer. Because the touch electrode layer may need to be penetrated by the keyboard frame or key components, in particular, when the relative position, shape, size, and quantity of the openings are inconsistent, the shape/size of some touch electrodes will be incomplete and inconsistent (or the position/quantity of the touch electrodes will be different), resulting in high variation in touch sensing data. Since it is too complicated and difficult to customize the configuration of local sensing area for each key, each text key is prone to experience false triggering or untriggered at different positions. The arrangement of the light source circuit further affects the consistency of shape/position of the touch electrodes, resulting in a great challenge to the uniformity or regularization of touch sensing of the luminous keyboard. The following embodiments of the invention are provided to address the above issues.

Figure 1B:
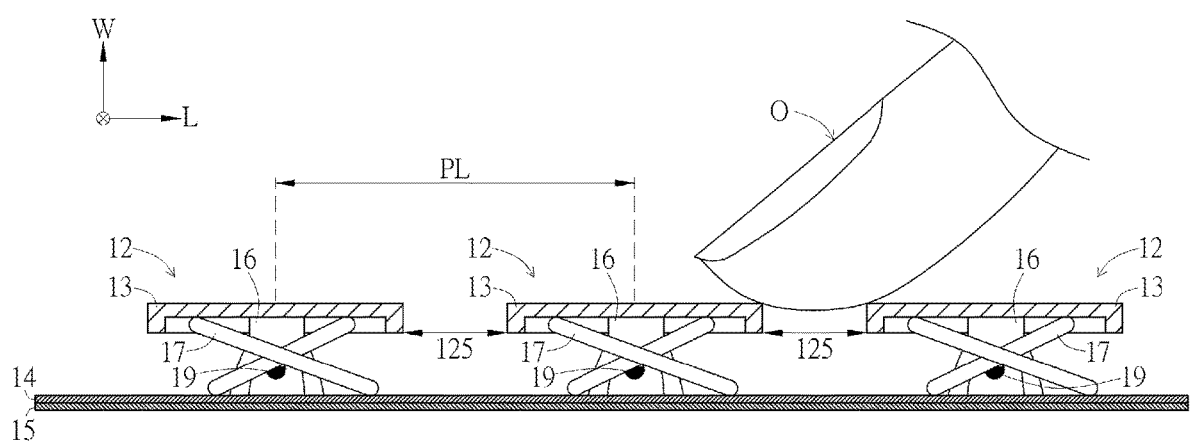
FIG. 1B is a cross-sectional partial view of the luminous touch keyboard according to the first embodiment of the invention.

Referring to FIGS. 1A and 1B, in the first embodiment, the touch keyboard 10 includes a plurality of keyswitch structures 12 and a keyboard composite electrode module 14, which can be integrated with the plurality of keyswitch structures 12 (for simplification, both are represented by a single component in FIGS. 1A and 1B). The keyswitch structure 12 includes a keycap 13, a baseplate 15, a restoring member 16, and a support mechanism 17 (shown in FIG. 1B). The keycap 13 is disposed over the baseplate 15. The restoring member 16 (e.g. a rubber dome) is disposed between the keycap 13 and the baseplate 15. The support mechanism 17 is connected between the keycap 13 and the baseplate 15. The plurality of keyswitch structures 12 share the same baseplate 15. The keyboard composite electrode module 14 is disposed between the baseplate 15 and the plurality of keycaps 13. The support mechanism 17 is configured to support the keycap 13 to move up and down relative to the baseplate 15 and the keyboard composite electrode module 14. The keycap 13 that moves downward can compress the restoring member 16, and the compressed restoring member 16 can provide a restoring force to drive the keycap 13 to move upward and return to its original position. The luminous touch keyboard 10 can define a virtual touch area 120 (only shown in FIG. 1A) for touch operations (including non-pressing movement) by the object O such as a user's finger or a stylus. The touch area 120 is substantially located on the middle part of the luminous touch keyboard 10 and covers the area of a plurality of keyswitch structures 12 (or the top area of the keycaps 13) and a plurality of key-gap layouts 125 (shown as a hatched area in FIG. 1A). Each key-gap layout 125 surrounds a corresponding keyswitch structure 12 (or keycap 13). The projection of the touch area 120 on the keyboard composite electrode module 14 is the touch area projection 140 (indicated by a dashed line in FIG. 1A). The projection of the keycap 13 on the keyboard composite electrode module 14 is the key projection zone 18 (indicated by a dashed line in FIG. 1A). The projection of the key-gap layout 125 on the keyboard composite electrode module 14 is the key-gap projection 143 (shown as a hatched area in FIG. 1A). The key-gap projection 143 surrounds the corresponding key projection zone 18. The touch area projection 140 covers a plurality of key projection zones 18 and corresponding key-gap projections 143. The keyboard composite electrode module 14 can sense the non-pressing movement of the object O in the touch area 120 and provide light emitting through the plurality of keycaps 13.

In addition, in the first embodiment, some of the keycaps 13 are text keys of equal size, i.e., single-size keys/square keys or alphanumeric keys, which can generate text signals to input English letters/numbers and some symbols. Others of the keycaps 13 surround the square keys, such as a small key of a smaller size or a multi-size key of a larger size. Generally, the ESC/F1~F12 function keys in the front row are the small-size key, and the Space/Enter/Shift/CapsLock/Ctrl keys are the multiple-size key. In this embodiment, the keyswitch structures 12 (or keycaps 13) corresponding to the touch area 120 are all of the same geometric size (e.g. square keys) and arranged in four rows, including the first row of key combination 121, the second row of key combination 122, the third row of key combination 123, and the fourth row of key combination 124. The key structures 12 of two adjacent rows are not aligned (i.e., adopting a staggered arrangement) in the second direction W (e.g. the width direction). Therefore, the key projection zones 18 are not aligned in the second direction W (i.e., also adopting staggered arrangement), and the key-gap projections 143 are arranged in a similar manner.

Figure 2A:
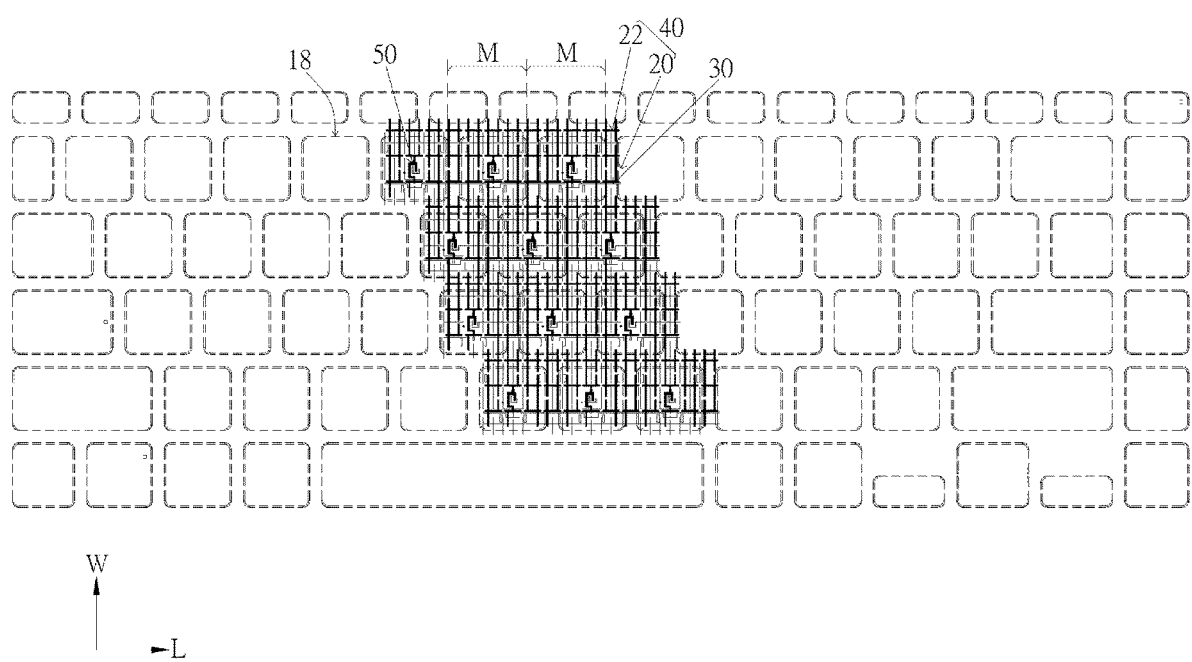
FIG. 2A is a schematic view of the partial electrode layout of the keyboard composite electrode module in FIGS. 1A and 1B.
Figure 2B:
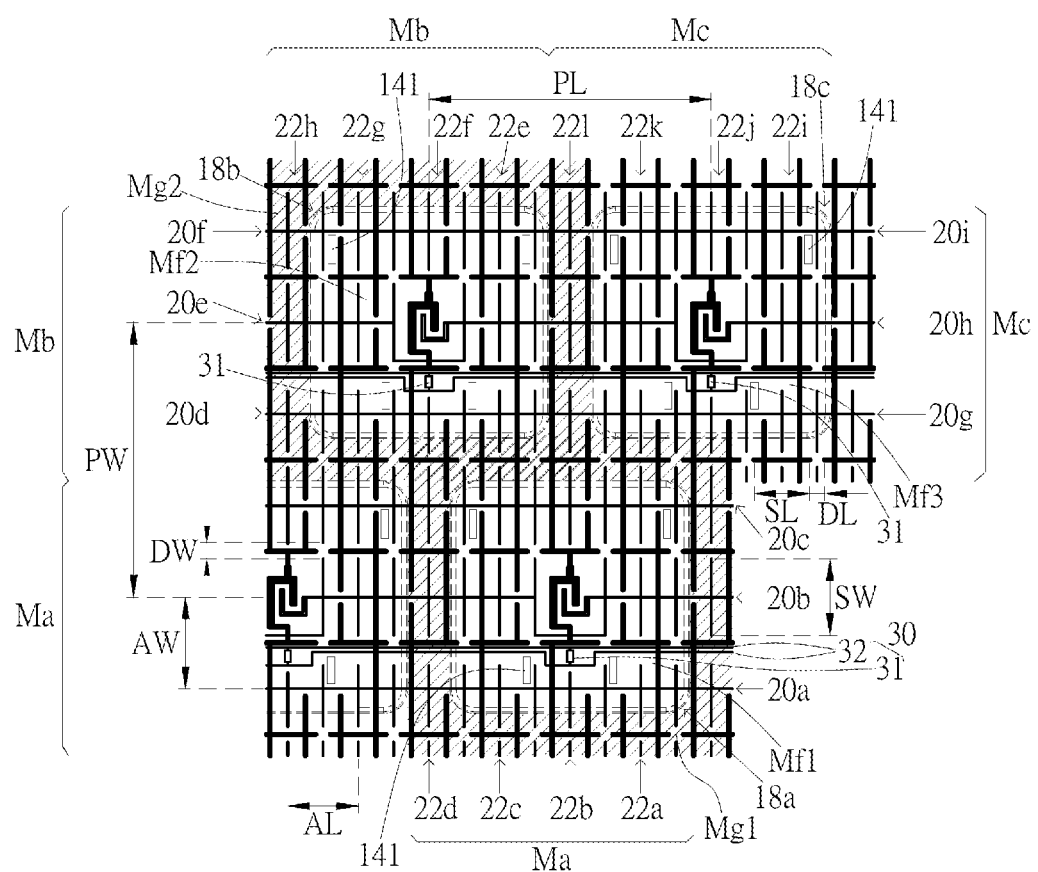
FIG. 2B is an enlarged view of the electrode pattern corresponding to three adjacent key projection zones in FIG. 2A.

Also referring to FIGS. 2A and 2B, in FIG. 2A, only part of the electrodes of the keyboard composite electrode module 14 are shown. In addition, the key projection zones 18 are also illustrated in FIGS. 2A and 2B to show the relative position of the electrode layout of the keyboard composite electrode module 14 to the key projection zones 18. The keyboard composite electrode module 14 includes a light source circuit 30 and a touch sensing circuit 40. The light source circuit 30 includes a plurality of light sources 31. The touch sensing circuit 40 includes a plurality of first electrode strings 20 (shown in the figure with thin solid lines) and a plurality of second electrode strings 22 (shown in the figure with bold solid lines). The plurality of first electrode strings 20 extend along the first direction L (e.g. the length direction) and are arranged at intervals in the second direction W (e.g. the width direction). The plurality of second electrode strings 22 extend along the second direction W and are arranged at intervals in the first direction L so as to be interlaced with the plurality of first electrode strings 20. Within the touch area projection 140 corresponding to the touch area 120, each key projection zone 18 covers the same key-face electrode pattern (e.g. Mf1, Mf2, Mf3), and each key surface electrode pattern (e.g. Mf1, Mf2, Mf3) includes one of the plurality of light sources 31. That is, in the keyboard composite electrode module 14, the plurality of light sources 31 are disposed corresponding to the plurality of keycaps 13 in a one-to-one manner.

Specifically, the plurality of first electrode strings 20 and the plurality of second electrode strings 22 are interlaced to form a plurality of electrode matrices M arranged along the first direction L and the second direction W. That is, the plurality of electrode matrices M formed by the interlaced arrangement of the plurality of first electrode strings 20 and the plurality of second electrode strings 22 are consecutively arranged along the first direction L and the second direction W. Each of the electrode matrices M has the same electrode layout (e.g. the quantity, shape, position, etc., of the first electrode strings/second electrode strings are correspondingly the same). Each of the electrode matrices M corresponds to one key projection zone 18, and two of the electrode matrices (e.g. Ma, Mb) adjacent in the second direction W are mis-aligned. In other words, the plurality of electrode matrices M correspond to the plurality of key projection zones 18 in a one-to-one manner. Therefore, the electrode matrices M are also arranged in the same manner as the key projection zones 18 located in the touch area projection 140, wherein two of the electrode matrices M adjacent in the second direction W are mis-aligned.

As shown in FIG. 2B, three key projection zones 18 are illustrated and marked as 18a~c, respectively. For example, the key projection zone 18a corresponds to the second row of key combination 122, and the key projection zones 18b and 18c correspond to the first row of key combination 121. The key projection zone 18a is located in the corresponding electrode matrix (marked as Ma); the key projection zone 18b (adjacent to the key projection zone 18a in the second direction W) is located in the corresponding electrode matrix (marked as Mb), and the key projection zone 18c (adjacent to the key projection zone 18b in the first direction L and adjacent to the key projection zone 18a in the second direction W) is located in the corresponding electrode matrix (marked as Mc). Also referring to FIGS. 3A and 3B, the schematic views of the electrode layout corresponding to the first electrode strings 20 and the second electrode strings 22 of the electrode matrices in FIG. 2B are shown, respectively. For the electrode matrix Ma, a plurality of sections of first electrode strings 20a~c and a plurality of sections of second electrode strings 22a~d are interlaced. For the electrode matrix Mb, a plurality of sections of first electrode strings 20d~f and a plurality of sections of second electrode strings 22e~h are interlaced. For the electrode matrix Mc, a plurality of sections of first electrode strings 20g~i and a plurality of sections of second electrode strings 22i~l are interlaced. The plurality of sections of first electrode strings 20d~f are respectively connected in series with the plurality of sections of first electrode strings 20g~i in the first direction L. The section of second electrode string 22a is connected in series with the section of second electrode string 22k in the second direction W. The section of second electrode string 22b is connected in series with the section of second electrode string 22l in the second direction W. The section of second electrode string 22c is connected in series with the section of second electrode string 22e in the second direction W. The section of second electrode string 22d is connected in series to the section of second electrode string 22f in the second direction W.

As shown in FIG. 2B, one key-gap projection (shown as the hatched area) surrounds the corresponding key projection zone 18a (i.e., around the corresponding electrode matrix Ma), and another key-gap projection (shown as the hatched area) surrounds the corresponding key projection zone 18b (i.e., around the corresponding electrode matrix Mb). The two key-gap projections are overlapped at the adjacent area of the electrode matrices Ma, Mb (key projection zones 18a, 18b). In the first embodiment, the arrangement of the plurality of first electrode strings 20 and the plurality of second electrode strings 22 is specially designed, so that each keycap 13 (or keyswitch structure 12) can correspond to the same electrode (or circuit) layout, improving the regularity of touch sensing data, reducing the breakpoints of the touch trace, improving the sensitivity of touch sensing, and also simplifying the design complexity of the touch electrodes.

As shown in FIGS. 2A and 2B, the arrangement pitch of the key projection zones 18 along the first direction L is defined as the key pitch PL. For example, the key pitch PL is the distance between the center of the key projection zone 18b and the center of the key projection zone 18c in the first direction L (or the distance between the centers of two keycaps 13 adjacent in the first direction L). The key projection zones 18 corresponding to the first row key combination 121 and the second row key combination 122 are staggered (or shifted) by a ½ PL. The key projection zones 18 corresponding to the second row key combination 122 and the third row key combination 123 are staggered (or shifted) by a ¼ PL. The key projection zones 18 corresponding to the third row key combination 123 and the fourth row key combination 124 are staggered (or shifted) by a ½ PL. In each of the electrode matrices M (e.g. the electrode matrix Ma), three sections of first electrode strings (e.g. 20a~c) and four sections of second electrode strings (e.g. 22a~d) are included. Therefore, as shown in FIG. 2B, taking the electrode matrix Ma and the electrode matrix Mb as an example, the electrode matrix Ma is shifted to the right by ½ PL in the first direction L with respect to the electrode matrix Mb, which is exactly a multiple of the arrangement pitch AL of the second electrode strings 22 in the first direction L (in this example, it is 2 times), so the sections of the second electrode strings 22c~d of the electrode matrix Ma can be aligned with the sections of the second electrodes strings 22e~f of the electrode matrix Mb. Such an alignment also occurs between other electrode matrices M corresponding to different rows of key combinations, and will not be elaborated. In addition, the arrangement pitch (i.e., the key pitch PL) between the electrode matrix Mb and the electrode matrix Mc in the first direction L is a multiple of the arrangement pitch AL (in this example, it is 4 times), so electrode matrix Mb and the electrode matrix Mc can correspond to the same layout of second electrode strings 22. The correspondence of the electrode layout also occurs between other electrode matrices M corresponding to the same row of key combination, and will not be elaborated. Furthermore, in the first embodiment, the arrangement pitch of the key projection zones 18 along the second direction W (for example, the distance between the center of the key projection zone 18a and the center of the key projection zone 18b in the second direction W) is defined as the key pitch PW, which is 3 times the arrangement pitch AW of the first electrode strings 20 in the second direction W, so the adjacent electrode matrices M (e.g. the electrode matrix Ma and the electrode matrix Mb) in the second direction W can correspond to the same layout of first electrode strings 20. Therefore, in the first embodiment, each of the key projection zones covers a same key-face electrode pattern in the corresponding electrode matrix M. For example, the key surface electrode patterns Mf1, Mf2, Mf3 covered by the key projection zones 18*a~c* are all the same (as shown in FIG. 2B). Each key-gap projection 143 covers the same key-gap electrode pattern. For example, the key-gap electrode patterns Mg1 and Mg2 covered by the key-gap projections are the same (as shown in FIG. 2B).

Figure 3A:
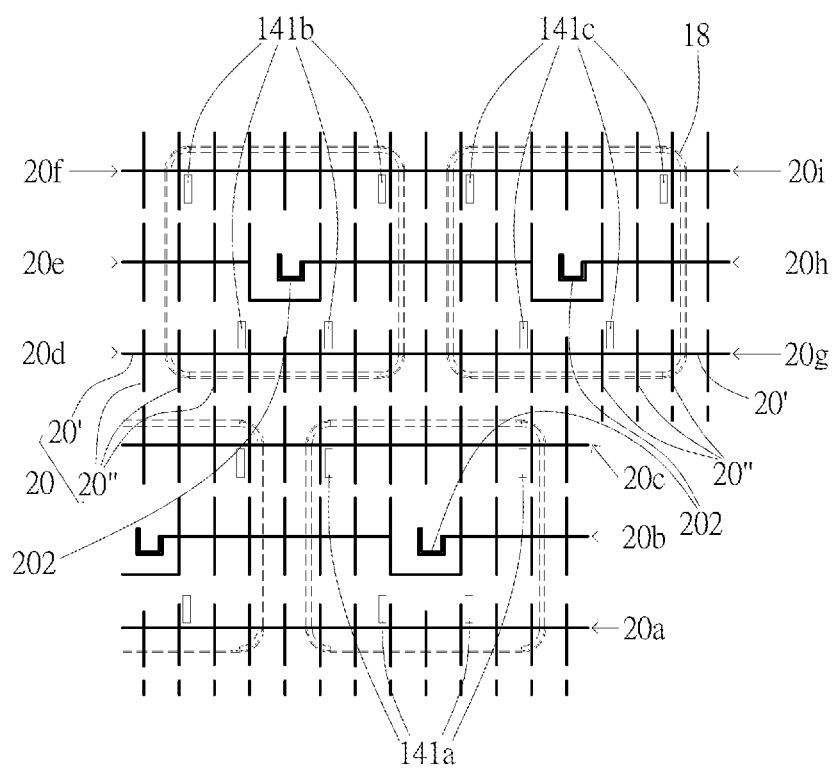
FIG. 3A is a schematic view of the electrode pattern of the plurality of first electrode strings in FIG. 2B.

Specifically, the plurality of first electrode strings 20 and the plurality of second electrode strings 22 of the touch sensing circuit 40 may have a Manhattan electrode configuration. As shown in FIG. 3A, each first electrode string 20 includes a plurality of first main sections 20' and a plurality of first branch sections 20" (as indicated in one of the first electrode strings). The plurality of first main sections 20' extend along the first direction L and are linearly connected to each other in series. The plurality of first branch sections 20" are arranged at intervals in the first direction L, and protrude from the plurality of first main sections 20' along the second direction W. For example, the plurality of electrode matrices (e.g. Mb, Mc) arranged along the first direction L can be connected in series with each other by connecting the corresponding first main section 20', such as the sections of the first electrode strings 20*d~f* respectively connected in series with the sections of the first electrodes strings 20*g~i* in the first direction L by their first main sections 20'. The plurality of first branch sections 20" are arranged at intervals in the first direction L and protrude from the corresponding first main sections 20' along the second direction W. In this embodiment, the plurality of first branch sections 20" are centered on the corresponding first main section 20' and protrude along the second direction W toward both sides by equal length, but not limited thereto. In other words, each of the first electrode strings 20 has a dendritic electrode configuration constituted of a main stem formed by the plurality of first main sections 20' extending along the first direction L and linearly connected in series and branches formed by the plurality of first branch sections 20" arranged at intervals on the string main stem.

Figure 3B:
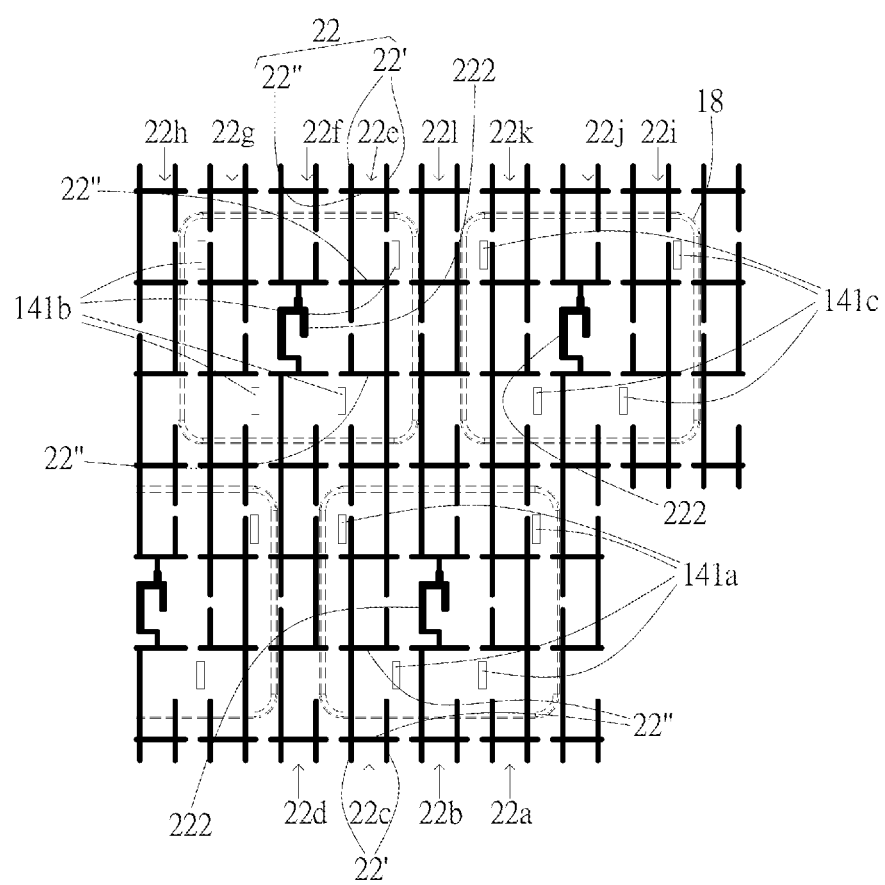
FIG. 3B is a schematic view of the electrode pattern of the plurality of second electrode strings in FIG. 2B.

As shown in FIG. 3B, each second electrode string 22 includes a plurality of second main sections 22' and a plurality of second branch sections 22" (as indicated in one of the second electrode strings). The plurality of second main sections 22' extend along the second direction W and are staggered arranged in two rows in the first direction L (for example, left row and right row). The plurality of second branch sections 22" are arranged at intervals along the second direction W and extend along the first direction L to connect the adjacent second main section 22' in the two rows. For example, a plurality of electrode matrices (such as Ma, Mb) staggered along the second direction W can be connected in series with each other by connecting the corresponding second main sections 22', such as the section of the second electrode string 22*c* and the section of the second electrode string 22*e* are connected in series in the first direction W by connecting the corresponding first main sections 22' in the two rows with the plurality of second branch sections 22". In other words, each second electrode string 22 has a dendritic electrode configuration with serrate main stems constituted by the plurality of second main sections 22' staggered along the first direction L and connected by the plurality of second branch sections 22".

Furthermore, referring to FIGS. 2B, 3A, and 3B, the arrangement intervals of the plurality of first branch sections 20" of the first electrode strings 20 in the first direction L are substantially the same, so that the plurality of first branch sections 20" are respectively disposed between two adjacent second main sections 22'. The arrangement intervals of the second branch sections 22" of the plurality of second electrode strings 22 in the second direction W are substantially the same, so that the plurality of second branch sections 22" are respectively disposed between two adjacent first main sections 20'. In other words, the plurality of second electrode strings 22 are interlaced with the first main sections 20' of the plurality of first electrode strings 20 only via some of the second main sections 22'.

In addition, in the first embodiment, the arrangements of the plurality of first electrode strings 20 and the plurality of second electrode strings 22 are specially designed, so that each of the keycaps 13 (or keyswitch structures 12) can correspond to the same electrode layout. Referring to FIGS. 2A and 2B, the plurality of first electrode strings 20 and the plurality of second electrode strings 22 are interlaced to form a uniform electrode distribution. The arrangement pitch AL of the second electrode strings 22 in the first direction L is equivalent to the arrangement pitch of the adjacent second branch sections 22" in the first direction L (that is, the distance between the centers of the adjacent second branch sections 22"). The arrangement pitch AW of the first electrode strings 20 in the second direction W is equivalent to the arrangement pitch of the adjacent first branch sections 20" in the second direction W (that is, the distance between the centers of the adjacent first branch sections 22"; in this embodiment, it is equal to the distance between the adjacent first main sections 20'). In practice, the length (or profile) of each first branch section 20" is substantially the same, and the size SW of the first branch section 20" in the second direction W is the function of key pitch PW, the gap DW of the adjacent first branch sections 20" in the second direction W, and the quantity of the first branch sections 20" covered by the key pitch PW in the second direction W. The size SL of the second branch section 22" in the first direction L is the function of the key pitch PL, the gap DL between the adjacent second branch sections 22" in the first direction L, and the quantity of second branch sections 22" covered by the key pitch PL in the first direction L. For example:

$$SW=(PW-DW*NW)/NW;$$

$$SL=(PL-DL*NL)/NL;$$

wherein PW represents the key pitch PW of two adjacent key projection zones 18 (e.g. the key projection zone 18*a*/18*b* or electrode matrix Ma/Mb in FIG. 2B) in the second direction W, and PL is the key pitch of two adjacent keys projection zones 18 (e.g. the key projection zone 18*b*/18*c* or the electrode matrix Mb/Mc in FIG. 2B) in the first direction L. DW represents the gap DW of two adjacent first branch sections 20" in the key projection zone 18 (e.g. the key projection zone 18*a*/18*b*/18*c* in FIG. 2B) or the electrode matrix M (e.g. Ma/Mb/Mc in FIG. 2B) in the second direction W, and DL represents the gap DL between two adjacent second branch sections 22" in the key projection zone 18 (e.g. the key projection zone 18*a*/18*b*/18*c* in FIG. 2B) or the electrode matrix M (e.g. Ma/Mb/Mc in FIG. 2B) in the first direction L. NW represents the number (or quantity) of rows of the electrodes covered by the key pitch PW in the second direction W (equivalent to the number of the first electrode strings 20 covered by the key pitch PW in the second direction W), and NL represents the number (or quantity) of columns of the electrodes covered by the key pitch PL in the first direction L (equivalent to the number of the second electrode strings 22 covered by the key pitch PL in the first direction L). SW represents the size of the first branch section 20" in the second direction W, and SL represents the size of the second branch section 22" in the first direction L.

The number of rows or columns (NW, NL) in one electrode matrix is the number of rows or columns of the electrode covered by the key pitch (PW, PL). Since two of the adjacent electrode matrices M/Ma/Mb/Mc are arranged continuously by certain electrode gaps, and usually the electrode gaps in the entire keyboard composite electrode module 14 are similar or the same, the number of rows or columns of the electrodes (NW, NL) is also equivalent to the line-row amount of the electrodes (or strings) covered in a single key projection zone 18/18*a*/18*b*/18*c* or electrode matrix M/Ma/Mb/Mc in the second direction W or the first direction L (i.e., single side), i.e., NW or NL is equivalent to the total number of rows or columns of electrodes (or strings) on a single side in the single key projection zone 18/18*a*/18*b*/18*c* or electrode matrix M/Ma/Mb/Mc. For the electrode matrix Ma/Mb/Mc in FIG. 2B, the number of rows or columns of the electrodes covered by the electrode matrix/Ma/Mb/Mc in the first direction L is 4 (i.e., 4 second electrode strings 22), and the number of rows or columns of the electrodes covered in the second direction W is 3 (i.e., 3 first electrode strings 20), i.e., 4 electrode rows or columns are covered by the key pitch PL (NL=4), and 3 electrode rows or columns are covered by PW (NW=3). In other words, the length SW of the first branch section 20" in the second direction W is equal to the key pitch PW minus the product of the number of rows or columns of the electrodes NW and the electrode gap DW, and then divided by the number of rows or columns of the electrodes NW. Similarly, the length SL of the second branch section 22" in the first direction L is equal to the key pitch PL minus the product of the number of rows or columns of the electrodes NL and the electrode gap DL, and then divided by the number of rows or columns of the electrodes NL.

For the above and the following embodiments of the invention, the electrode gap (DL/DW) and the electrode size (SW/SL) are fixed values. Based on the equation for the second direction W, the size of any electrode in the second direction W is the function of the key pitch of the key projection zones 18 PW, the electrode gap DW, and the number of rows or columns of the electrode NW in each electrode matrix Ma/Mb (or covered by the key pitch PW). Similarly, the foregoing equation can also be used in the first direction L, i.e., the size of any electrode in the first direction L is the function of the key pitch of the key projection zones 18 PL, the electrode gap DL, and the number of rows or columns of the electrode NL in each electrode matrix Ma/Mb (or covered by the key pitch PL). In summary, for the electrodes of same size and shape, the size of the electrode in the second direction W/the first direction L (e.g. the side length of a rectangle or the diagonal length of a rhombus) can be derived according to the above equation.

Figure 3C:
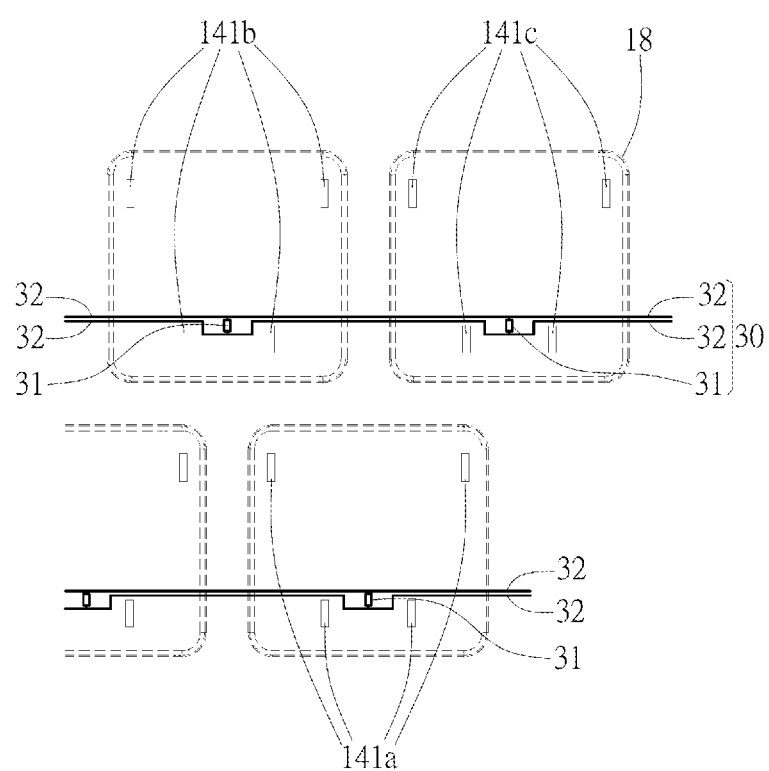
FIG. 3C is a schematic view of the electrode pattern of the light source circuit in FIG. 2B.

As shown in FIG. 2B and FIG. 3C, the light source circuit 30 includes a plurality of light source wirings 32 for electrically coupling the plurality of light sources 31. The plurality of light source wirings 32 extend along the first direction L and are arranged at intervals in the second direction W, so that the plurality of light source wirings 32 are arranged at intervals with the plurality of first electrode strings 20 and interlaced with the plurality of second electrode strings 22. In each of the key projection zones 18, the position of each of the light sources 31 in the electrode matrix M are correspondingly the same, and the configuration of the light source circuit 32 in each electrode matrix M is also correspondingly the same. For example, the plurality of second electrode strings 22 are interlaced with the plurality of light source circuits 32 only via some of the second main sections 22'. The light source wirings 32 in pairs extend along the first direction L through the adjacent electrode matrices (e.g. Mb, Mc), and have electrical contacts extending toward each other. Each of the light sources 31 (e.g. LEDs) can be electrically coupled to the electrical contacts by the surface mounting technology to be electrically coupled to the pair of light source wirings 32. In this way, each of the key projection zones covers the same key-face electrode pattern (e.g. Mf1, Mf2, Mf3), which consists of a portion of the plurality of first electrode strings 20, a portion of the plurality of second electrode strings 22, a portion of the pair of the light source wirings 32, and one light source 31.

It should be noted that due to the arrangement of the light source circuit 30, the configuration of the plurality of first electrode strings 20 and the plurality of second electrode strings 22 in the touch sensing circuit 40 may be slightly changed. For example, since the plurality of light source wirings 32 extend along the first direction L and are arranged at intervals in the second direction W (i.e., the light source wirings 32 are arranged in pairs in the second direction W between two of the adjacent first electrode strings), the first branch sections 20" of the first electrode strings 20, which are adjacent to the light source circuit 32, can be slightly modified corresponding to the layout of the light source wirings 32 and the position of the light source 31. For example, the length of the first branch sections 20" can be reduced to reserve a space for disposing the light source circuit 30. Since the positions of the light sources 31 in the corresponding electrode matrices M/Ma/Mb/Mc are the same, the key-face electrode pattern (e.g. Mf1/Mf2/Mf3) corresponding to each key projection zone 18 is also the same even when the light source 31 is included. Therefore, each keycap 13 (or keyswitch structure 12) can correspond to the same electrode layout, which improves the regularity of touch sensing data, reduces the breakpoints of the touch trace, improves the sensitivity of touch sensing, and simplifies the design complexity of touch electrodes.

Figure 3D:
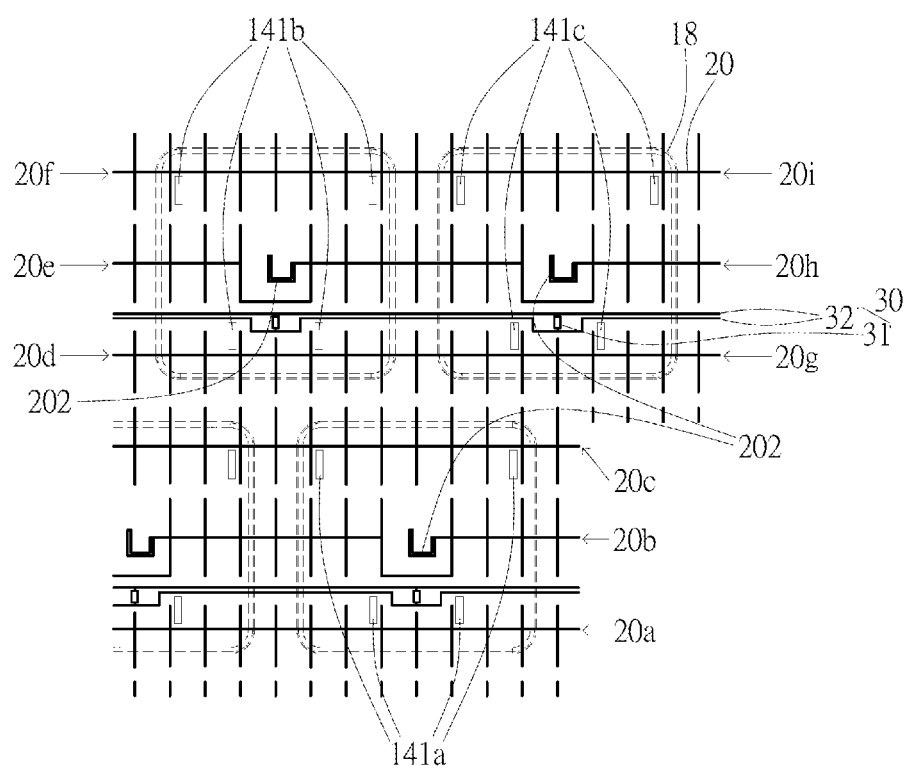
FIG. 3D is a schematic view of the electrode pattern of the light source circuit and the plurality of first electrode strings in FIG. 2B.

In addition, referring to FIG. 3D, the plurality of light source wirings 32 in the light source circuit 30 and the plurality of first electrode strings 20 extend along the first direction L and are arranged at intervals in the second direction W, so that the light source circuit 30 can be integrated with the plurality of first electrode strings 20 into the same layer of the circuit design, but it is not limited thereto. According to the actual design of the light source circuit, the plurality of light source wirings 32 in the light source circuit 30 can extend along the second direction W and be arranged at intervals in the first direction L, so as to be integrated with the plurality of second electrode strings 22 into the same layer of the circuit design. Alternatively, the light source circuit, the plurality of first electrode strings 20, and the plurality of second electrode strings 22 can be independently different layers of the circuit design.

In addition, in the first embodiment, the keyboard composite electrode module 14 is located between the baseplate 15 and the keycaps 13, so the keyboard composite electrode module 14 has a plurality of openings 141 (shown in FIG. 2B) to provide a space required for the connection between the support mechanism 17 and the baseplate 15. The openings 141 are located right under the keycap 13 and will affect the key-face electrode pattern. As shown in FIGS. 3A/3B/3C, the key-face electrode pattern Mf1 of the key projection zone 18*a* has a layout of openings 141*a*, which is defined by the openings 141 corresponding to the key projection zone

18*a*. The key-face electrode pattern Mf2 of the key projection zone 18*b* has a layout of openings 141*b*, which is defined by the openings 141 corresponding to the key projection zone 18*b*. The key-face electrode pattern Mf3 of the key projection zone 18*c* has a layout of openings 141*c*, which is defined by the openings 141 corresponding to the key projection zone 18*c*. The layouts of openings 141*a*, 141*b*, and 141*c* are the same. That is, the number and positions of the openings of the key-face electrode pattern corresponding to each of the key projection zones 18 are the same.

Referring to the FIGS. 2B/3A/3C, the key-face electrode pattern (e.g. Mf1, Mf2, Mf3) further includes a first contact portion 202 and a second contact portion 222. The first contact portion 202 and the second contact portion 222 respectively extend from one of the first electrode strings 20 and one of the second electrode strings 22. For example, in the electrode matrix M (Ma/Mb/Mc) corresponding to the key projection zone 18, the first contact portion 202 is formed by one of the first electrode strings 20 closer to the center of the key projection zone 18, and the second contact portion 222 is formed by one of the second electrode strings 22 closer to the center of the key projection zone 18, so that the first contact portion 202 and the second contact portion 222 are opposed to each other without connection. In other words, in the luminous touch keyboard 10, the switch circuit 50 may include a plurality of switch units 52 consisting of pairs of the first contact portion 202 and the second contact portion 222, and the plurality of switch units 52 are disposed corresponding to the plurality of keycaps 13 in a one-to-one manner.

Figure 4:
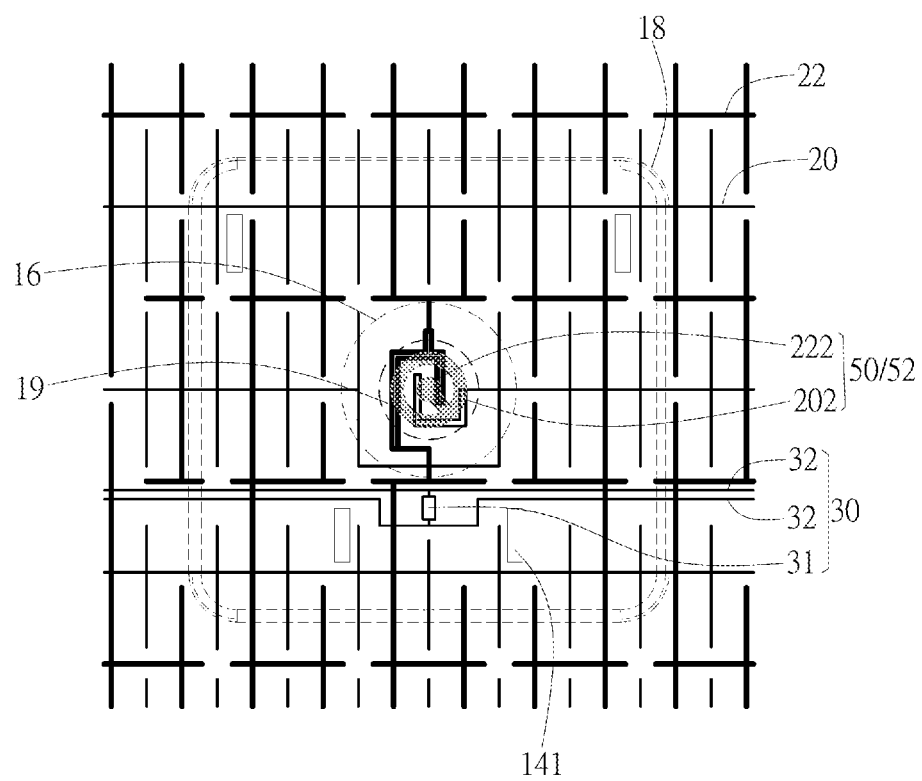
FIG. 4 is a schematic view showing the relationship between the electrode layout and the conductive coupling portion corresponding to a single keyswitch in FIG. 1B.

As shown in FIG. 4, the first contact portion 202 and the second contact portion 222 can be conducted via a conductive coupling portion 19. In one embodiment, the conductive coupling portion 19 can be a conductive portion disposed on any suitable components of the keyswitch structure 12, for example, a conductive portion disposed on the downward protruding portion of the restoring member 16. In other words, the first contact portion 202 and the second contact portion 222 constitute a switch unit 52, and the keycap 13 can be pressed to trigger the corresponding switch unit 52. For example, the restoring member 16 is compressed and deformed, so that the conductive portion (i.e., the conductive coupling portion 19) moves downward to contact the first contact portion 202 and the second contact portion 222, so that the switch unit 52 is triggered to generate a trigger signal (such as a text signal), and then the corresponding key input function is performed. In this embodiment, the conductive coupling portion 19 includes a contact surface (for example, the conductive material is substantially completely disposed on the bottom surface of the protruding portion of the restoring member 16), and the first contact portion 202 and the second contact portion 222 each includes at least one contact line, so that the first contact portion 202 and the second contact portion 222 are electrically connected to each other when the contact surface comes in contact with the contact lines, thereby generating the trigger signal. In one embodiment, the contact line can be, for example, one of a straight line, a curve, a loop, a rectangle, and a serration, or any combination thereof.

Figure 5A:
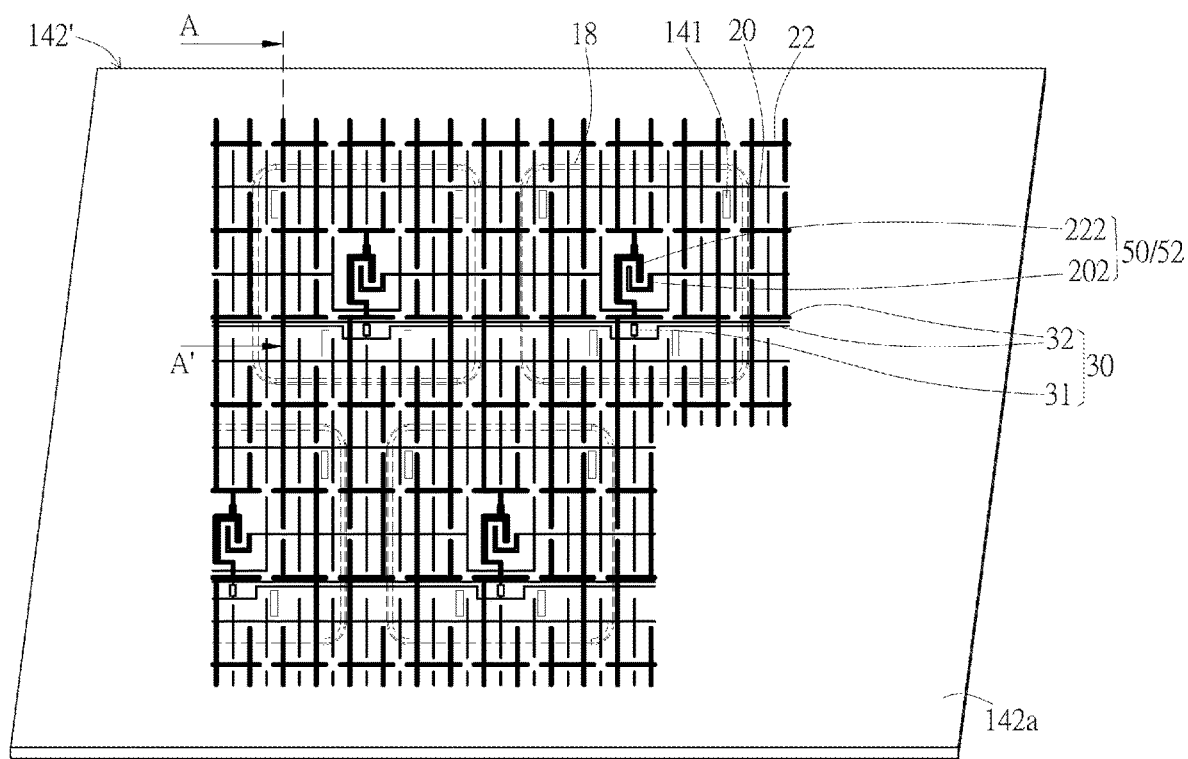
FIG. 5A is a schematic partial view of the keyboard composite electrode module on the substrate according to the first embodiment of the invention.
Figure 5B:
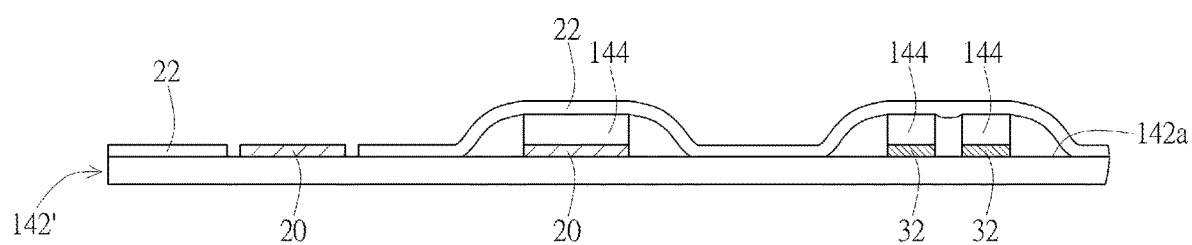
FIG. 5B is a schematic cross-sectional partial view of FIG. 5A, showing an exemplary stack configuration of the light source circuit, the first electrode strings, and the second electrode strings on the substrate.
Figure 6:
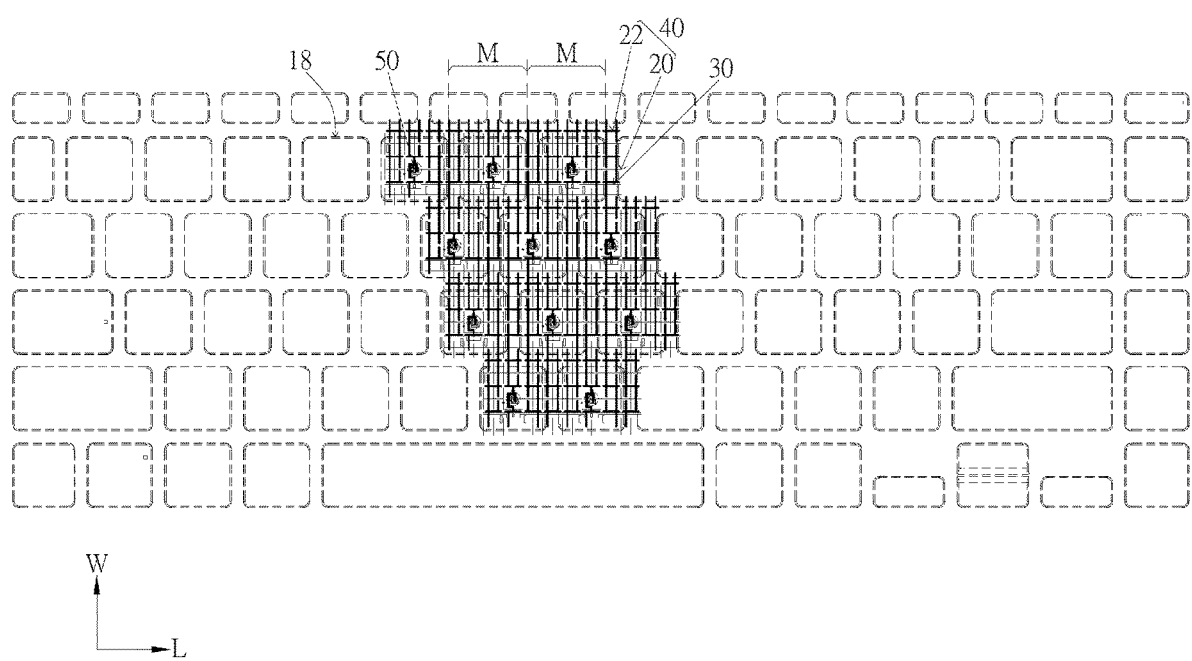
FIG. 6 is a schematic view of a partial electrode layout of the keyboard composite electrode module according to the second embodiment of the invention.

As shown in FIGS. 5A and 5B, in the first embodiment, the keyboard composite electrode module 14 includes a single substrate as the bearing structure for bearing the light source circuit 30 and the touch sensing circuit 40. For example, the bearing structure includes a first substrate 142'. The light source circuit 30, the plurality of first electrode strings 20, and the plurality of second electrode strings 22 are disposed on the same surface of the first substrate 142' (e.g. the first upper surface 142*a* which faces the keycap 13), and at locations where the second electrode strings 22 are interlaced with the light source circuit 30 and the plurality of first electrode strings 20, an insulation layer 144 is disposed between the plurality of second electrode strings 22 and the light source circuit 30 and between the plurality of second electrode strings 22 and the plurality of first electrode strings 20. For example, the light source circuit 30 (i.e., the plurality of light source wirings 32) and the plurality of first electrode strings 20 can be formed on the first upper surface 142*a* of the first substrate 142' with the circuit layout shown in FIG. 3D by using printing technology, wherein the projections of the light source circuit 30 and the plurality of first electrode strings 20 on the first substrate 142' do not overlap. After that, a dot-shaped insulation layer can be formed by using the printing technology at the position where the plurality of light source wirings 32 and the plurality of first electrode strings 20 (i.e., the plurality of first main sections 20') will be intersected with the plurality of second electrode strings 22. Then, the plurality of second electrode strings 22 can be formed on the first upper surface 142*a* of the first substrate 142' with the electrode layout shown in FIG. 3B by using the printing technology, so that at the locations where the plurality of second electrode strings 22 are interlaced with the light source circuit 30 and the plurality of first electrode strings 20, the light source circuit 30 (or the plurality of first electrode strings 20) is located between the plurality of second electrode strings 22 and the first substrate 142'. In other words, at the locations where the plurality of second electrode strings 22 are interlaced with the light source circuit 30 (or the plurality of first electrode strings 20), the second main section 22' is stacked on the light source wirings 32 (or the first main section 20') with the insulation layer 144 interposed therebetween, instead of being directly formed on the first upper surface 142*a* or the light source circuit 30 (or the plurality of first electrode strings 20). At the locations where the plurality of second electrode strings 22 are not interlaced with the light source circuit 30 (or the plurality of first electrode strings 20), the plurality of second electrode strings 221 can be directly formed on the first upper surface 142*a*. In such a configuration, a protective layer (not shown in the figure) can be optionally formed to cover the plurality of light source wirings 32 (excluding the electrical contacts), the plurality of first electrode strings 20, and the plurality of second electrode strings 22, providing protection and insulation effects. The light sources 31 can be electrically connected to the electrical contacts of the corresponding light source wirings 32 by using the surface mounting technology to form a three-in-one single-layer composite electrode module structure, wherein the light source circuit 30, the touch sensing circuit 40, and the switch circuit 50 are disposed on the single substrate.

In the above embodiment, the keyboard composite electrode module 14 uses the single substrate as the bearing structure to bear the light source circuit 30 and the touch sensing circuit 40, but not limited thereto. In other embodiments, the keyboard composite electrode module 14 can use a multi-layer substrate as the bearing structure to bear the light source circuit 30, the touch sensing circuit 40, the switch circuit 50, etc. Furthermore, the conductive coupling portion used to trigger the switch unit (e.g. switch unit 52) can also be integrated into the keyboard composite electrode module instead of being disposed on the key components (e.g. the conductive portion disposed on the restoring member 16). As shown in FIGS. 6 and 7A to 7D, the bearing structure includes the first substrate 142', a second substrate

Figure 7A:
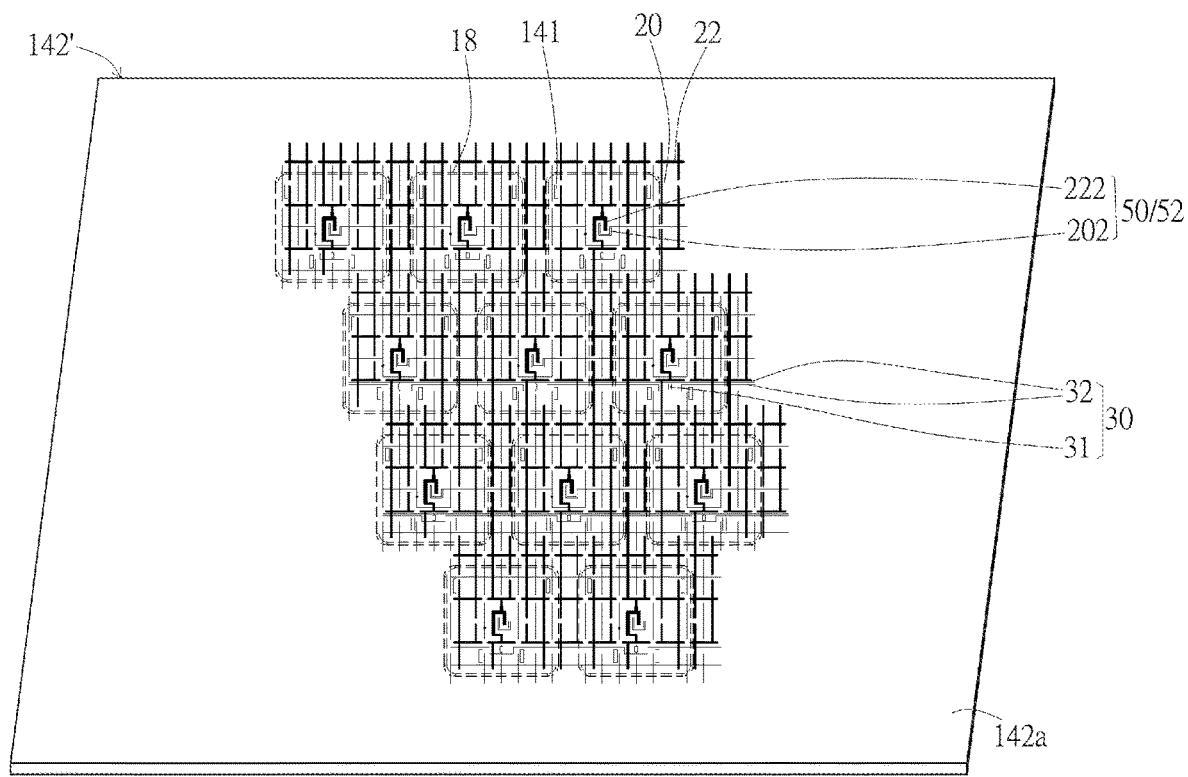

146', and a spacer layer 144'. The second substrate 146' is disposed opposite to the first substrate 142', and the spacer layer 144' is sandwiched between the first substrate 142' and the second substrate 146'. As shown in FIG. 7A, the light source circuit 30, the plurality of first electrode strings 20 (including the first contact portions 202), and the plurality of second electrode strings 22 (including the second contact portions 222) are disposed on the same surface (e.g. the first upper surface 142a) of the first substrate 142'. The configuration and structure details of the light source circuit 30, the plurality of first electrode strings 20, and the plurality of second electrode strings 22 can refer to the related descriptions of foregoing embodiments (for example, FIGS. 2A-5B), and will not be elaborated hereinafter.

Figure 7B:
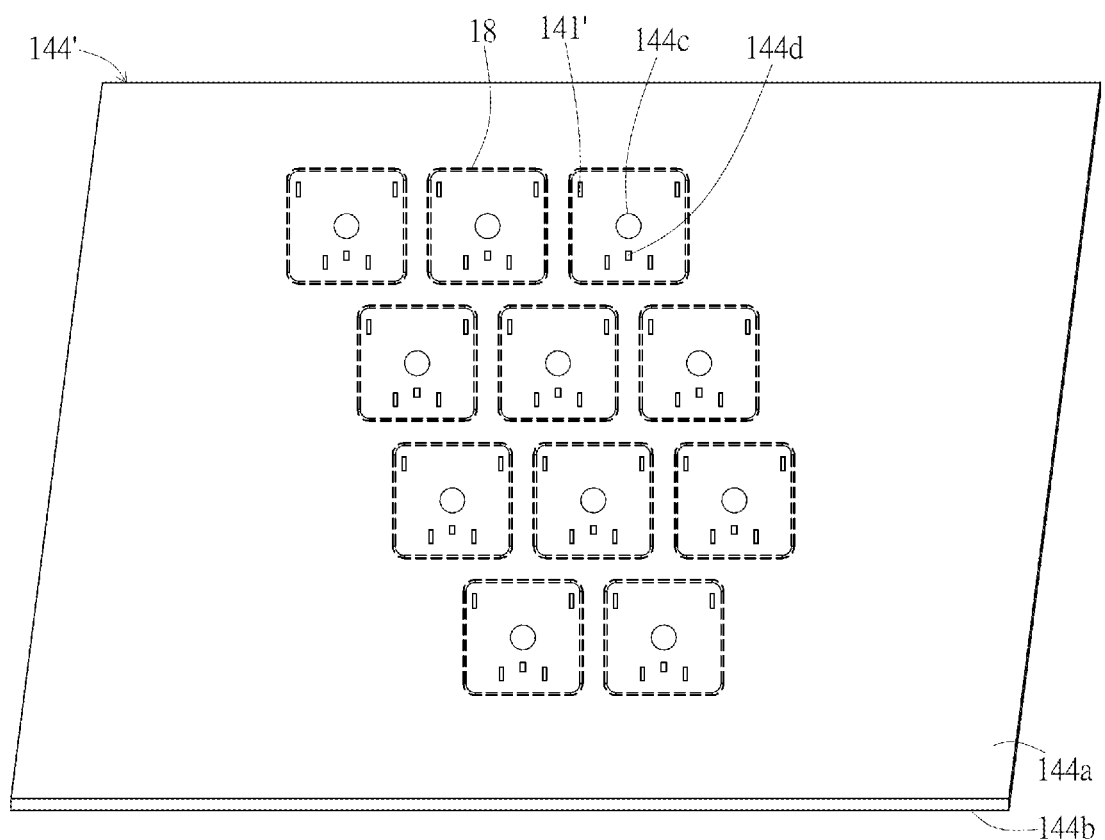

As shown in FIG. 7B, the spacer layer 144' has a plurality of through holes 144c, which are disposed corresponding to the plurality of switch units 52 of the switching circuit 50 in a one-to-one manner. For example, each through hole 144c is a hole penetrating from the upper surface 144a to the lower surface 144b of the spacer layer 144', so that the first contact portion 202 and the second contact portion 222 formed on the first substrate 142' as the switch unit 52 can be exposed from the through hole 144c. The spacer layer 144' further has a plurality of through holes 144d at positions corresponding to the plurality of light sources 31 for allowing the light sources 31 to extend therethrough. In addition, the spacer layer 144' can have a plurality of openings 141' providing a space for the connection between the support mechanism 17 and the baseplate 15. That is, the positions of the plurality of openings 141' of the spacer layer 144' correspond to the plurality of openings 141 of the first substrate 142'.

Figure 7C:
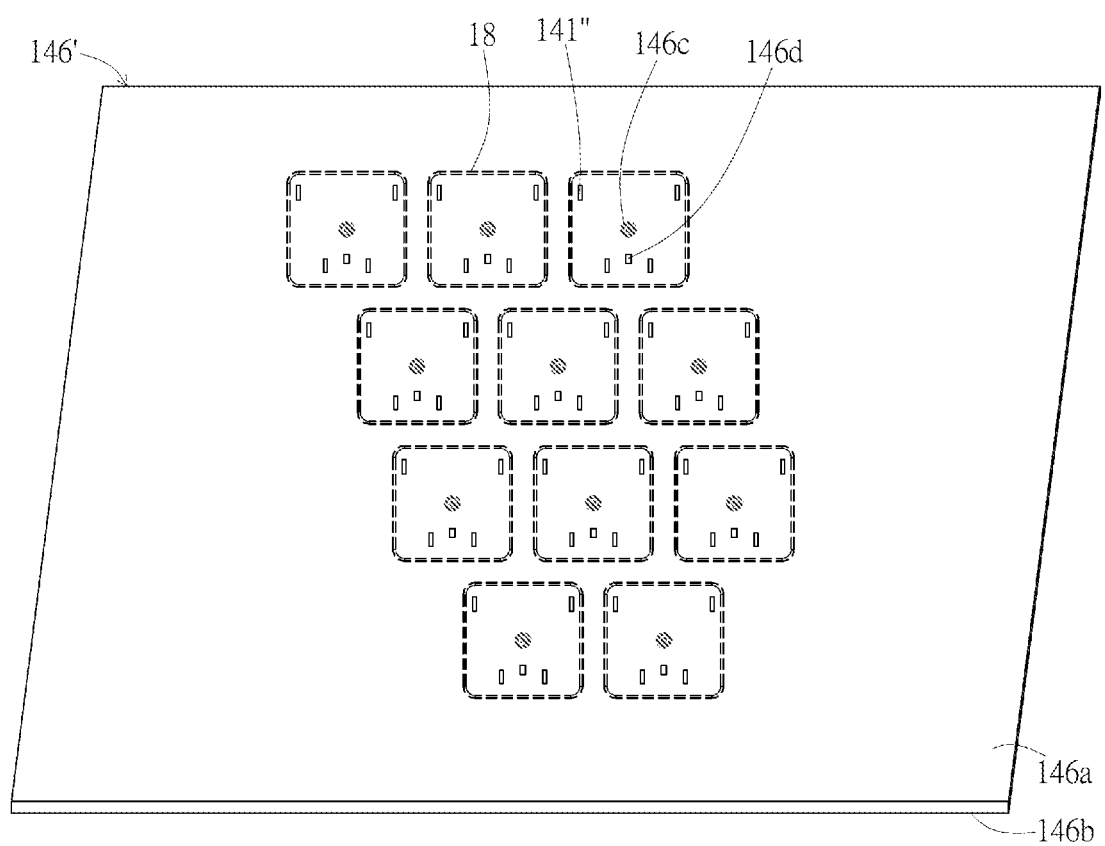
Figure 7D:
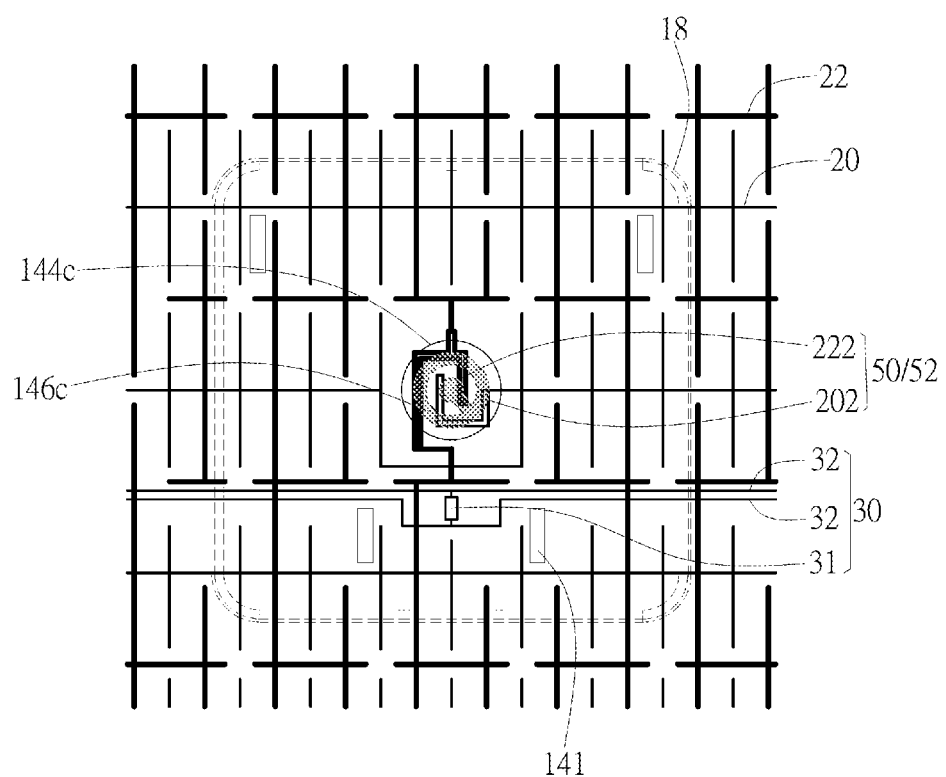
FIG. 7D is a schematic view showing the relationship between the electrode layout and the conductive coupling portion corresponding to the single keyswitch of FIG. 6.
Figure 8:
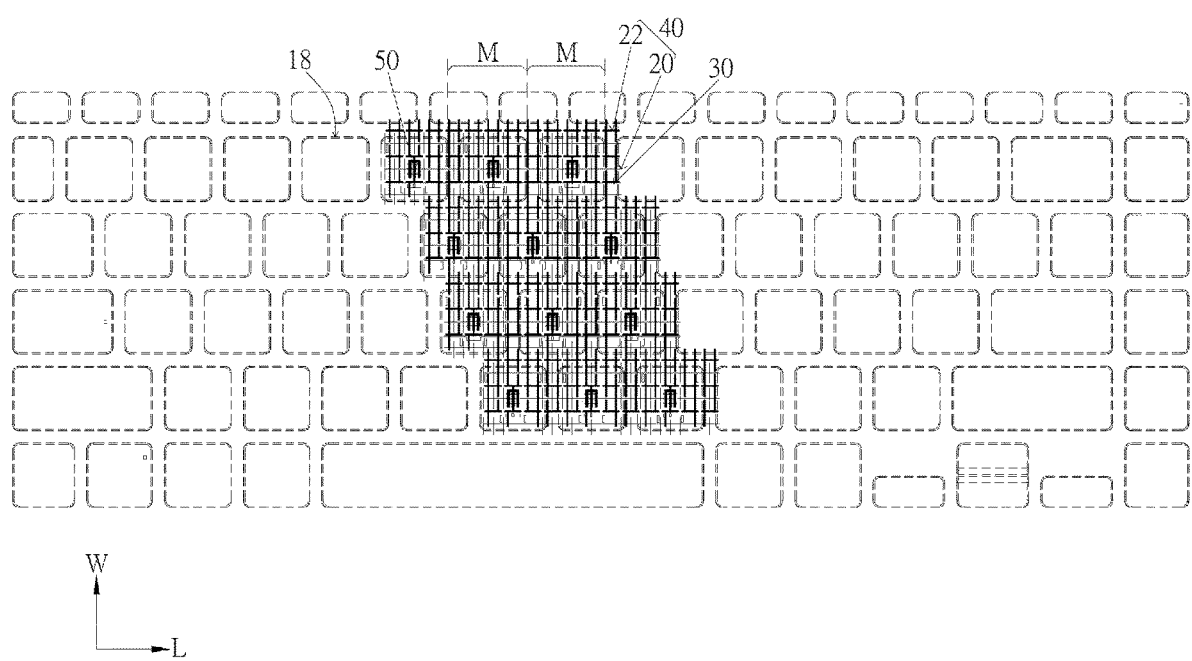
FIG. 8 is a schematic view of a partial electrode layout of a keyboard composite electrode module according to the third embodiment of the invention.

As shown in FIG. 7C, a plurality of conductive coupling portions 146c are formed on the second substrate 146'. Specifically, the second substrate 146' has a second upper surface 146a and a second lower surface 146b. The second upper surface 146a is a surface that faces away from the first substrate 142', and the second lower surface 146b is a surface that faces toward the first substrate 142'. The plurality of conductive coupling portions 146c are formed on the second lower surface 146b of the second substrate 146' and disposed opposite to the switch unit 52 (i.e., the first contact portion 202 and the second contact portion 222) with respect to the through hole 144c. The second substrate 146' further has a plurality of through holes 146d corresponding to the plurality of light sources 31 for allowing the light sources 31 extend therethrough. In addition, the second substrate 146' can have a plurality of openings 141" providing a space for the connection between the support mechanism 17 and the baseplate 15. That is, the positions of the plurality of openings 141" of the second substrate 146' correspond to the plurality of openings 141' of the spacer layer 144' and the plurality of openings 141 of the first substrate 142'. It should be noted that the layout of the conductive coupling portions 146c shown in FIG. 7C is a see-through view from the second upper surface 146a. As shown in FIG. 7D, when the first substrate 142', the spacer layer 144', and the second substrate 146' are stacked in sequence from bottom to top, the drawings in FIGS. 7A, 7B, and 7C can be stacked in sequence, so that the key-face electrode patterns covered by the key projection zones 18 may have a configuration similar to that of FIG. 4, wherein the first contact portion 202 and the second contact portion 222 are arranged opposite to the conductive coupling portion 146c with respect to the through hole 144c. The portion of the keyboard composite electrode module 14 corresponding to the first contact portion 202 and the second contact portion 222 is pressable, so that the conductive coupling portion 146c can be electrically coupled to the first contact portion 202 and the second contact portion 222 through the through hole 144c. That is, when the keycap 13 is pressed, the keycap 13 moves toward the baseplate 15 with the support of the support mechanism 17, and presses against the second substrate 146' of the keyboard composite electrode module 14 through the restoring member 16, so that the second substrate 146' is locally deformed downward, and the conductive coupling portion 146c comes in contact with the first contact portion 202 and the second contact portion 222 through the through hole 144c to generate the trigger signal.

Furthermore, when the first substrate 142', the spacer layer 144', and the second substrate 146' are sequentially stacked from bottom to top, the plurality of openings 141" of the second substrate 146', the plurality of openings 141' of the spacer layer 144', and the plurality of openings 141 of the first substrate 142' are aligned and communicate with each other to provide a space required for the connection between the support structure 17 and the baseplate 15. The plurality of through holes 144d of the spacer layer 144' and the plurality of through holes 146d of the second substrate 146' are aligned and communicated with each other to allow the plurality of light sources 31 disposed on the first substrate 142' to extend from the lower surface 144b of the spacer layer 144' sequentially through the through hole 144d and the through hole 146d, and to be exposed from the second upper surface 146a of the second substrate 146'. As such, the light provided by the light sources 31 can emit through the corresponding keycaps 13.

Figure 9A:
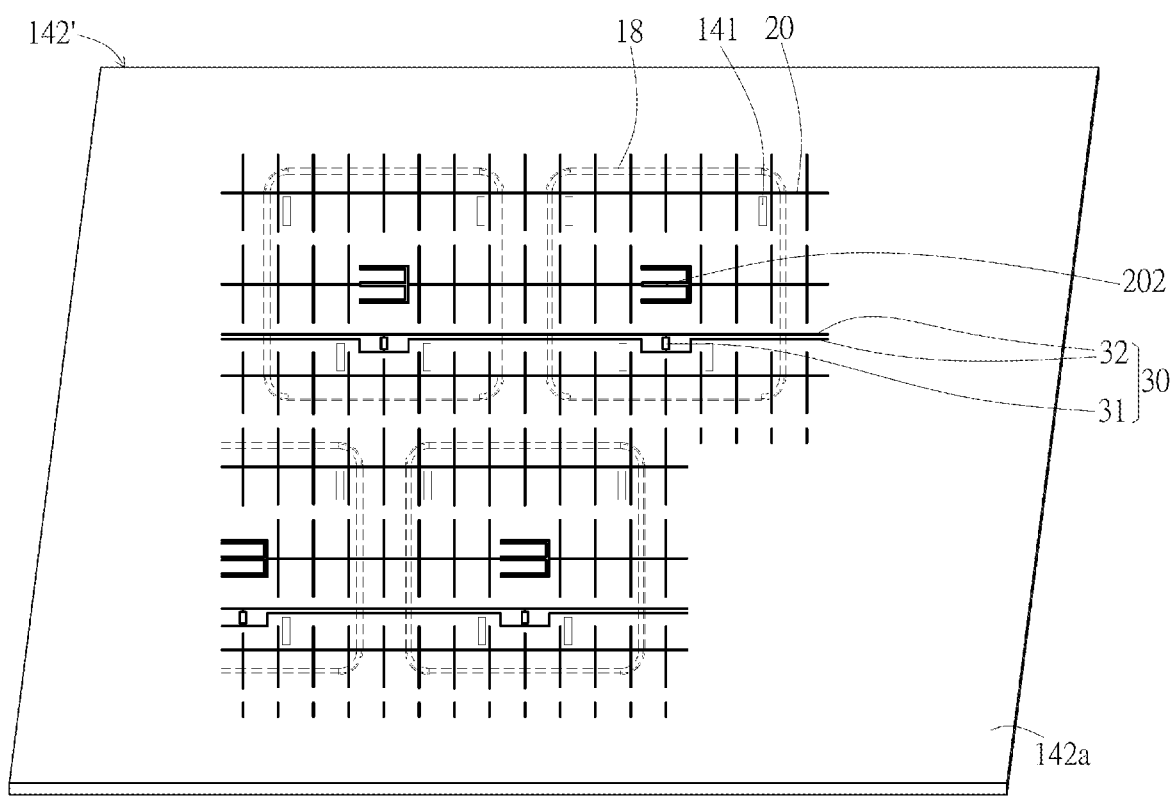
Figure 9B:
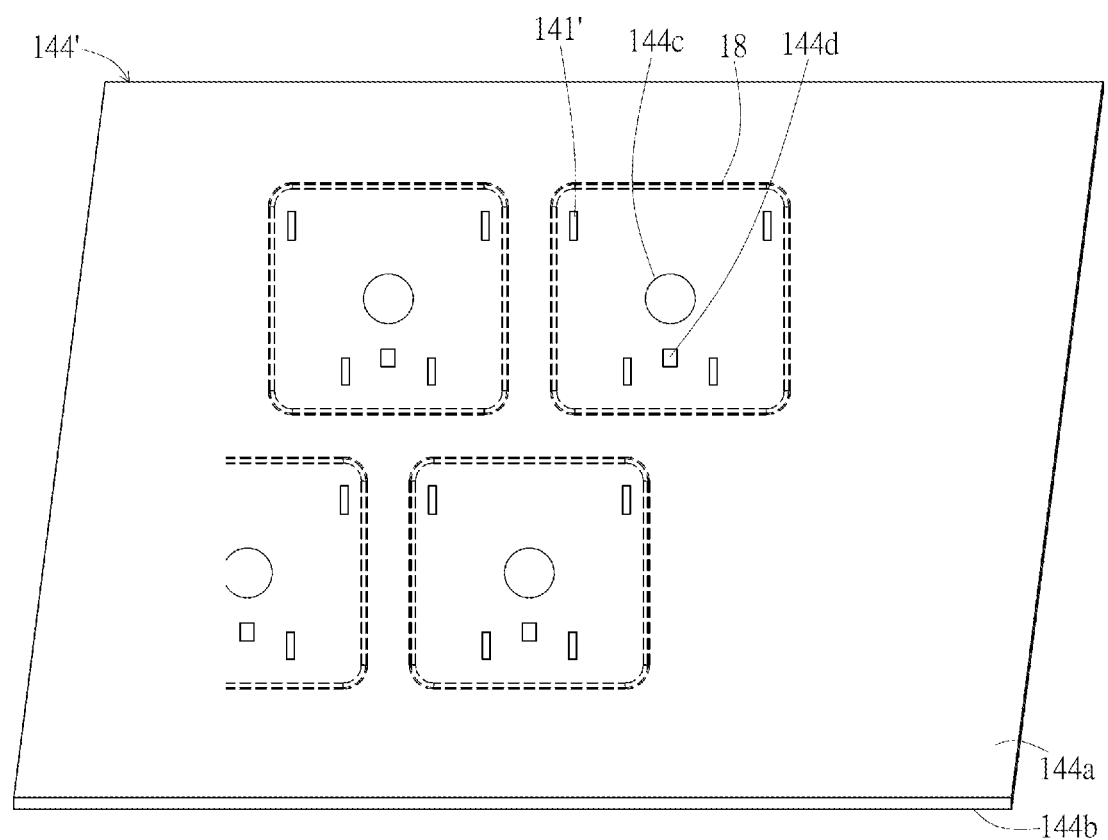
Figure 9C:
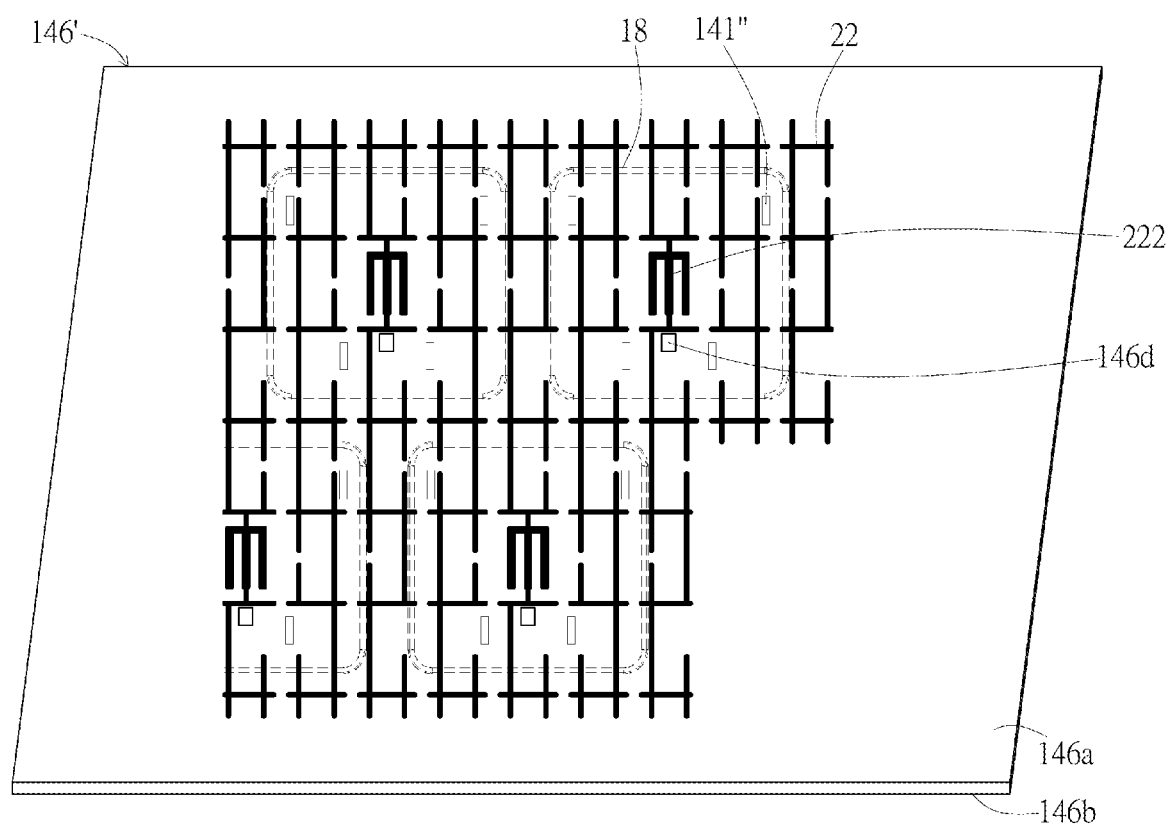

In the above embodiments, the light source circuit 30, the touch sensing circuit 40, and the switch circuit 50 are all formed on the same surface of the same substrate, but not limited thereto. In other embodiments, the light source circuit 30, the touch sensing circuit 40, and the switch circuit 50 of the keyboard composite electrode module 14 can be formed on the same substrate or different substrates. As shown in FIGS. 8 and 9A to 9C, the bearing structure includes a first substrate 142', a second substrate 146', and a spacer layer. The second substrate 146' is disposed opposite to the first substrate 142', and the spacer layer 144' is sandwiched between the first substrate 142' and the second substrate 146'. As shown in FIGS. 9A-9C, the light source circuit 30 and the plurality of first electrode strings 20 (including the first contact portions 202) are disposed on the same surface of the first substrate 142' (e.g. the first upper surface 142a), and the plurality of second electrode strings 22 (including the second contact portions 222) are formed on the second lower surface 146b of the second substrate 146'. In this embodiment, the configuration and structure details of the light source circuit 30, the plurality of first electrode strings 20, and the plurality of second electrode strings 22 can refer to the related descriptions of the above embodiments (e.g. FIGS. 2A-5B), and the difference is in that the shapes of the first contact portion 202 and the second contact portion 222 are different (for example, in the form of contact lines or in a comb/fork shape or any suitable shape). In this embodiment, the spacer layer 144' has structural details similar to those of FIG. 7B, and the layout of the plurality of second electrode strings 22 (including the second contact portions 222) shown in FIG. 9C is a see-through view from the second upper surface 146a.

Figure 10:
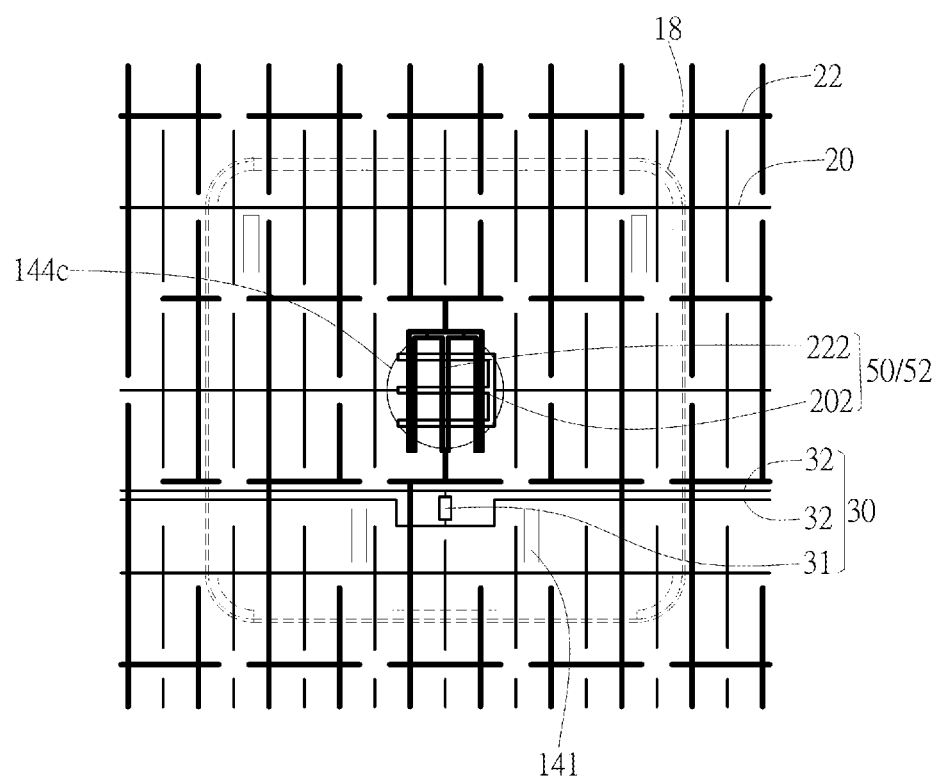
FIG. 10 is a schematic view of the electrode layout corresponding to the single keyswitch in FIG. 8.

As shown in FIG. 10, when the first substrate 142', the spacer layer 144', and the second substrate 146' are sequentially stacked from bottom to top, the first contact portion 202 and the second contact portion 222 are disposed opposite to each other with respect to the through hole 144c in the key-face electrode pattern corresponding to each key projection zone 18. The portion of the keyboard composite electrode module 14 corresponding to the first contact portion 202 and the second contact portion 222 is pressable, such that the first contact portion 202 and the second contact portion 222 come in contact with each other via the through hole 144c. That is, when the keycap 13 is pressed, the keycap 13 moves toward the baseplate 15 with the support of the support mechanism 17, and presses against the second substrate 146' of the keyboard composite electrode module 14 by the restoring member 16, so that the second substrate 146' is locally deformed downward, and the second contact portion 222 comes in contact with the first contact portion 202 through the through hole 144c to generate a trigger signal. In addition, the configuration of the light sources 31 and the connection between the support mechanism 17 and the baseplate 15 in the bearing structure can refer to the related descriptions of the above embodiments.

Figure 11A:
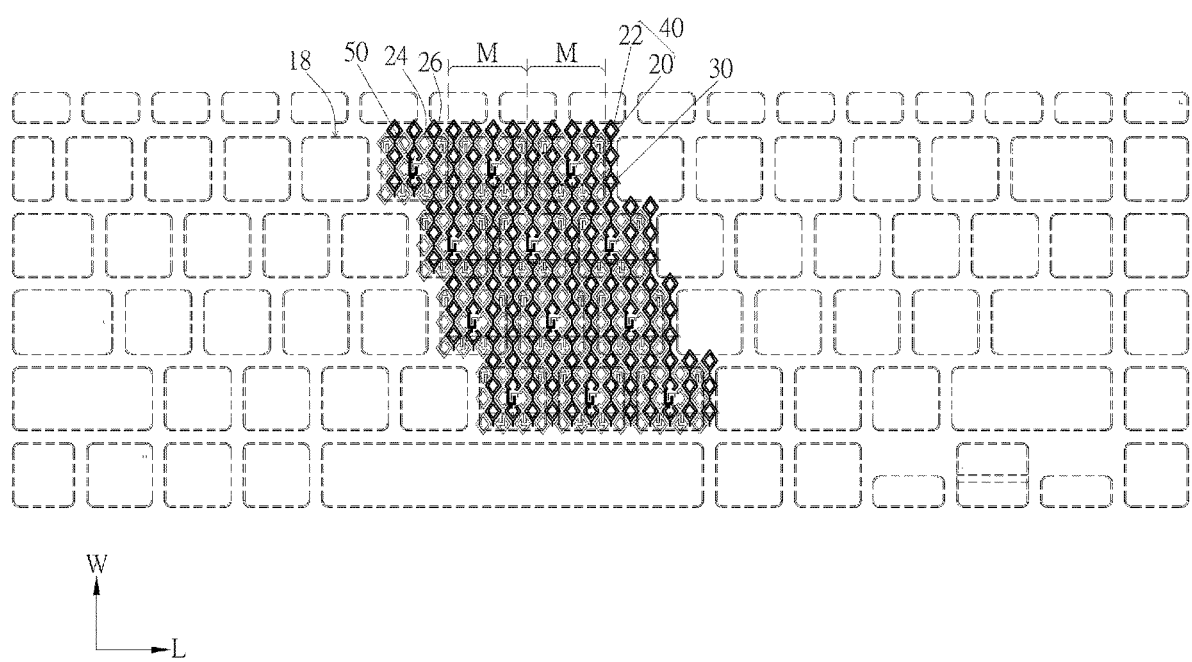
FIG. 11A is a schematic view of a partial electrode layout of the keyboard composite electrode module according to the fourth embodiment of the invention.
Figure 11B:
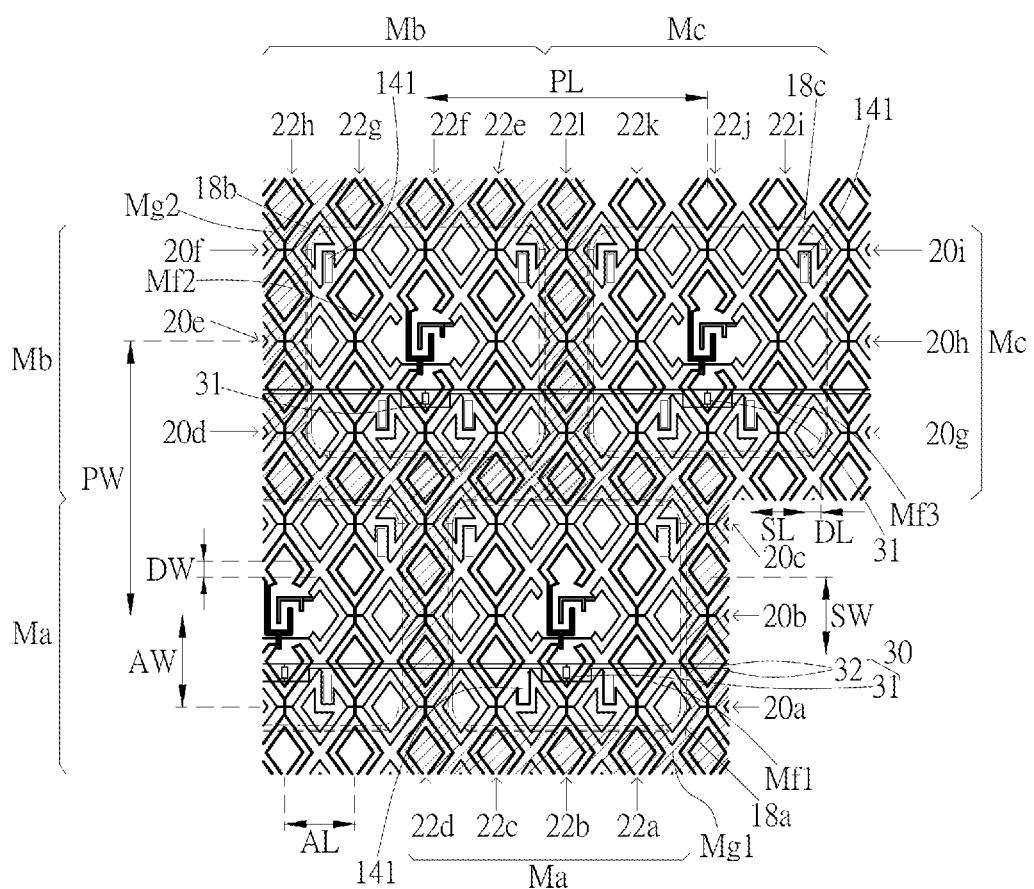
FIG. 11B is an enlarged view of the electrode pattern corresponding to three adjacent key projection zones in FIG. 11A.

In the above embodiment, the configuration of the touch sensing circuit is described as the dendritic electrode configuration, but not limited thereto. In other embodiments, each electrode string of the touch sensing circuit may have different forms of electrodes, such as rectangles, diamonds, and so on. Referring to FIGS. 11A and 11B, in this embodiment, the keyboard touch electrode module includes a plurality of first electrode strings 20 (shown in the figure with thin solid lines) and a plurality of second electrode strings 22 (shown in the figure with bold solid lines). Each first electrode string 20 includes a plurality of first electrodes 24 connected in series, and each second electrode strings 22 includes a plurality of second electrodes 26 connected in series. The plurality of first electrode strings 20 extend linearly in parallel to the first direction L and are arranged at intervals in the second direction W. That is, the first electrodes 24 in each first electrode string 20 are linearly connected. The plurality of second electrode strings 22 extend linearly in parallel to the second direction W and are arranged at intervals in the first direction L. That is, the second electrodes 26 in each second electrode string 22 are linearly connected. The plurality of first electrode strings 20 and the plurality of second electrode strings 22 are interlaced to form a uniform distribution of electrodes. The plurality of first electrode strings 20 and the plurality of second electrode strings 22 form a plurality of same electrode matrices M, which are consecutively arranged along the first direction L and the second direction W. Each electrode matrix M has the same electrode layout (including the number and relative positions of the first electrodes 24 and the second electrodes 26). The plurality of electrode matrices M correspond to the plurality of the key projection zones 18 in an one-to-one manner. Therefore, the electrode matrices M are also arranged in the same arrangement as the key projection zones 18 located in the touch area projection 140, wherein two of the electrode matrices M adjacent in the second direction W are mis-aligned.

Similar to the configuration of FIG. 2B, FIG. 11B also shows three key projection zones, respectively marked as 18a~c, and their corresponding electrode matrices Ma~c. The configuration of the plurality of first electrode strings 20 (including the first contact portions 202) and the plurality of second electrode strings 22 (including the second contact portions 222) may respectively refer to FIGS. 12A and 12B. In each electrode matrix, the configuration of a plurality of sections of first electrode strings (e.g. 20a~c, 20d~f, 20g~i) and a plurality of sections of second electrode strings (e.g. 22a~d, 22e~h, 22i~l) may refer to the related descriptions of the first embodiment. That is, the key-face electrode pattern of the corresponding electrode matrix M covered by each key projection zone 18 is the same. For example, the key-face electrode patterns Mf1, Mf2, Mf3 respectively covered by the key projection zones 18a~c are the same. The key-gap electrode pattern covered by each key-gap projection is the same. For example, the key-gap electrode patterns Mg1 and Mg2 respectively covered by the key-gap projections are the same. The layout of openings of each key-face electrode pattern is also the same. For example, the layouts of openings 141a, 141b, and 141c are the same.

In this embodiment, the arrangement pitch AL of the first electrode strings 20 in the first direction L is also equivalent to the arrangement pitch of the adjacent first electrodes 24 in the first direction L. The arrangement pitch AW of the first electrode strings 20 in the second direction W is also equivalent to the arrangement pitch of the adjacent second electrodes 26 in the width direction W. In practice, the contour of each first electrode 24 is substantially the same. The size SW of the first electrode 24 (or the second electrode 26) in the second direction W is a function of a key pitch PW, the gap DW between the adjacent first electrodes 24 (or second electrodes 26) in the second direction W, and the number of the first electrodes 24 (or the second electrodes 26) covered by the key pitch PW. The size SL of the first electrode 24 (or the second electrode 26) in the first direction L is a function of a key pitch PL, the gap DL between the adjacent first electrodes 24 (or second electrodes 26) in the first direction L, and the number of the first electrodes 24 (or the second electrodes 26) covered by the key pitch PL. That is, in this embodiment, the relationship of the size of the first electrode 24 (or the second electrode 26) can also be expressed by the above equation, namely $w=[P-(D*N)]/N$, wherein P represents the key pitch (distance from center to center in the first direction W or the second direction L, e.g. distance component PW or PL) of two key projection zones 18 (or the two electrode matrices Ma/Mb in FIG. 11B) adjacent in the first direction W; D represents the electrode gap DW or DL between two electrodes (two first electrodes 24/two second electrodes 26, or one first electrode 24 and one second electrode 26) adjacent in the key projection zone 18/electrode matrix Ma/Mb in the second direction W or the first direction L; N represents the number of rows or columns of the electrodes NW or NL covered by the key pitch P in the second direction W or the first direction L; w represents the side length of the first electrodes 24 in the second direction W. In other words, the side length w of the first electrodes 24 in the second direction W is equal to the key pitch P minus the product of the number of rows or columns of the electrodes N and the electrode gap D, and then divided by the number of rows or columns of the electrodes N. For the electrode matrix Ma/Mb/Mc in FIG. 11B, the number of rows or columns of the electrodes covered by the electrode matrix/Ma/Mb/Mc in the first direction L is 4, and the number of rows or columns of the electrodes covered in the second directions W is 3, i.e., 4 rows or columns of electrodes covered by the key pitch PL (NL=4), and 3 rows or columns of electrodes covered by PW (NW=3). In summary, for the electrodes of same size and shape, the size of the first electrode 24/the second electrode 26 in the second direction W/the first direction L (e.g. the side length of a rectangle or the diagonal length of a rhombus) can be derived according to the above equation.

In this embodiment, the linear connection of the electrodes refers that the two electrodes connected to each other are at the position corresponding to a longitudinal or transverse direction, and the central line of the two electrodes straightly connected is straight and will be parallel to the second direction W or the first direction L. In this embodiment, the first electrodes 24 and the second electrodes 26 are presented in rhombus, which can increase the area utilization of the electrode distribution, and can also increase the degree of interlacing between the first electrodes 24 and the second electrodes 26, facilitating the improvement of the sensing accuracy of the touch position.

Furthermore, corresponding to the arrangement of the light source circuit 30, the first electrodes 24 and the second electrodes 26 are preferably presented in hollow rhombuses. That is, the first electrode 24 surrounds and forms the first electrode light-transparent portion 24a, and the second electrode 26 surrounds and forms the second electrode light-transparent portion 26a. The plurality of light sources 31 of the light source circuit 30 are preferably correspondingly disposed in the first electrode light-transparent portion 24a or the second electrode light-transparent portion 26a, but not limited thereto. In other embodiments (not shown), the first electrodes 24 and the second electrodes 26 may be presented in solid rhombuses, and only the electrodes (e.g. the second electrode 26) at the positions corresponding to the light sources 31 adopt the hollow rhombus design or a notched electrode design, to reserve the space (e.g. the second electrode light-transparent portion 26a) for the light sources 31. For example, as shown in FIGS. 12C and 12D, the plurality of light source wirings 32 of the light source circuit 30 may extend along the first direction L and be disposed between the adjacent first electrode strings 20 in the second direction W, and the light source 31 may be disposed in the second electrode light-transparent portion 26a surrounded by one of the second electrodes 26. As such, the light provided by the light sources 31 can emit through the corresponding keycaps 13.

Figure 12A:
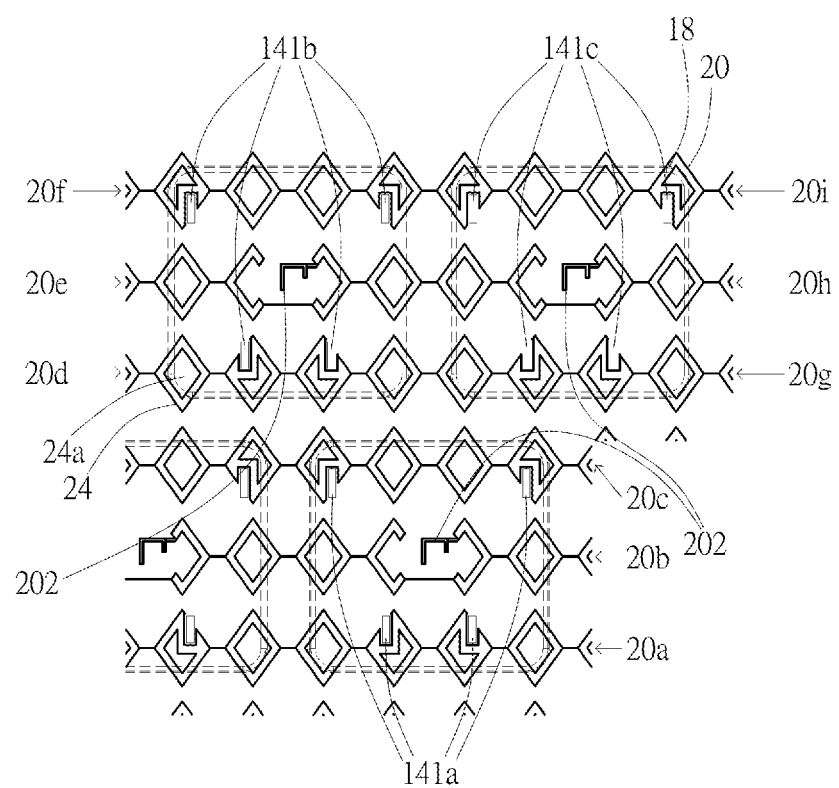
FIG. 12A is a schematic view of the electrode pattern of the plurality of first electrode strings in FIG. 11B.
Figure 12B:
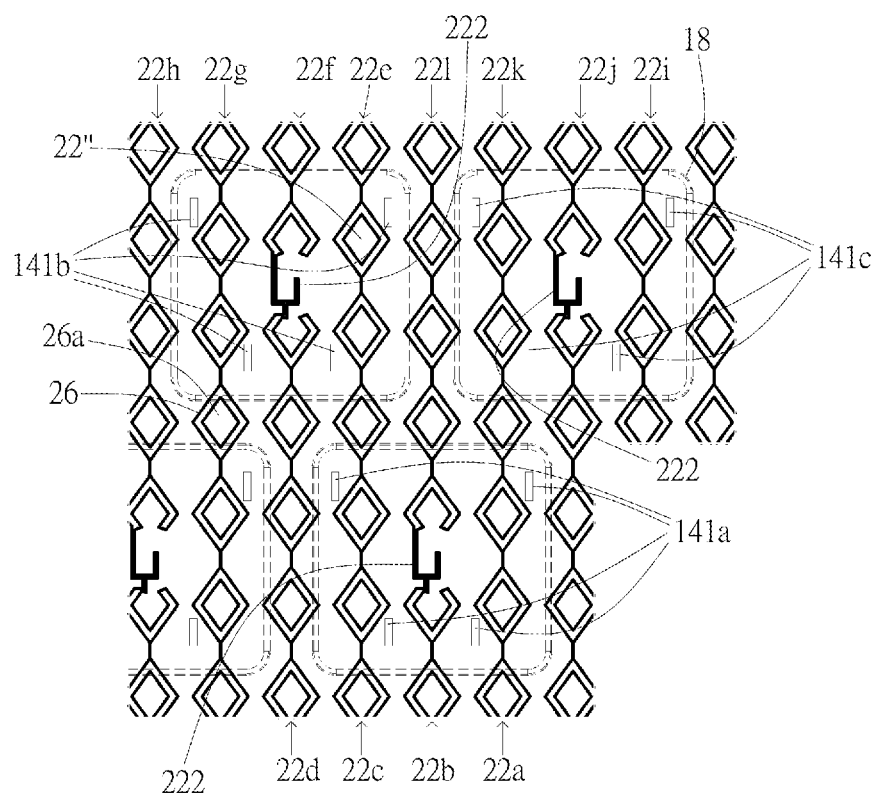
FIG. 12B is a schematic view of the electrode pattern of the plurality of second electrode strings in FIG. 11B.
Figure 12C:
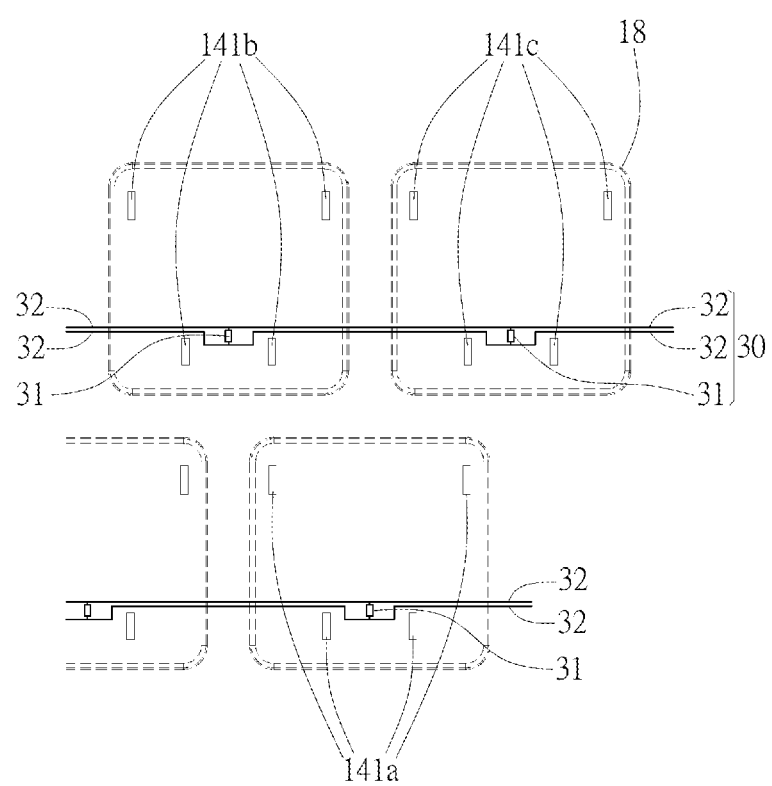
FIG. 12C is a schematic view of the electrode pattern of the light source circuit in FIG. 11B.
Figure 12D:
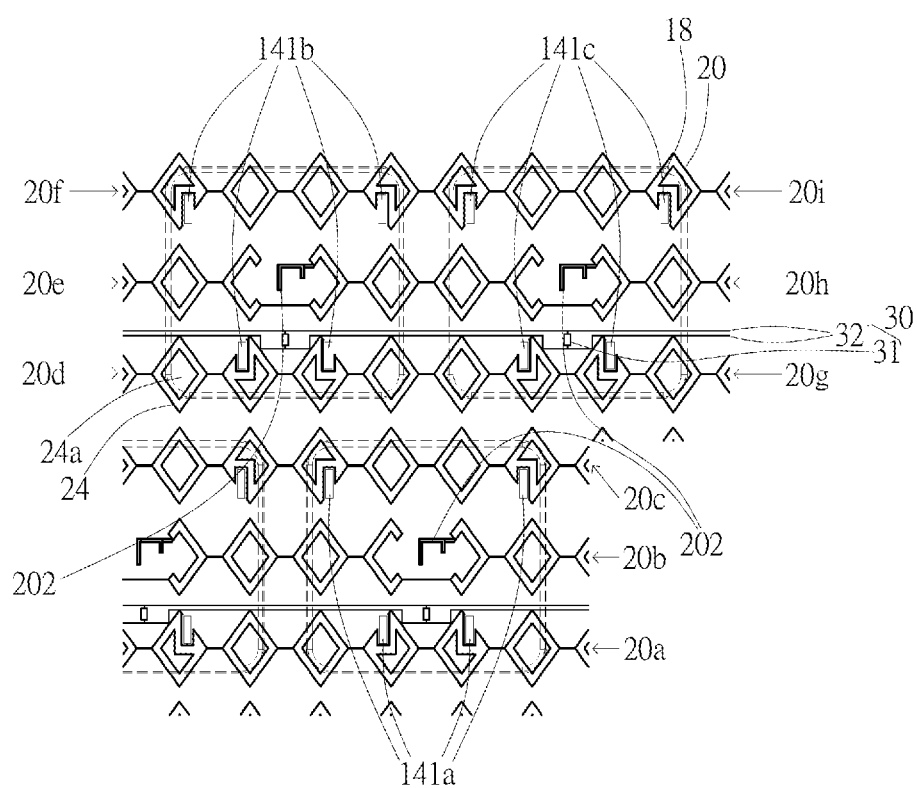
FIG. 12D is a schematic view of the electrode pattern of the light source circuit and the plurality of first electrode strings in FIG. 11B.
Figure 13:
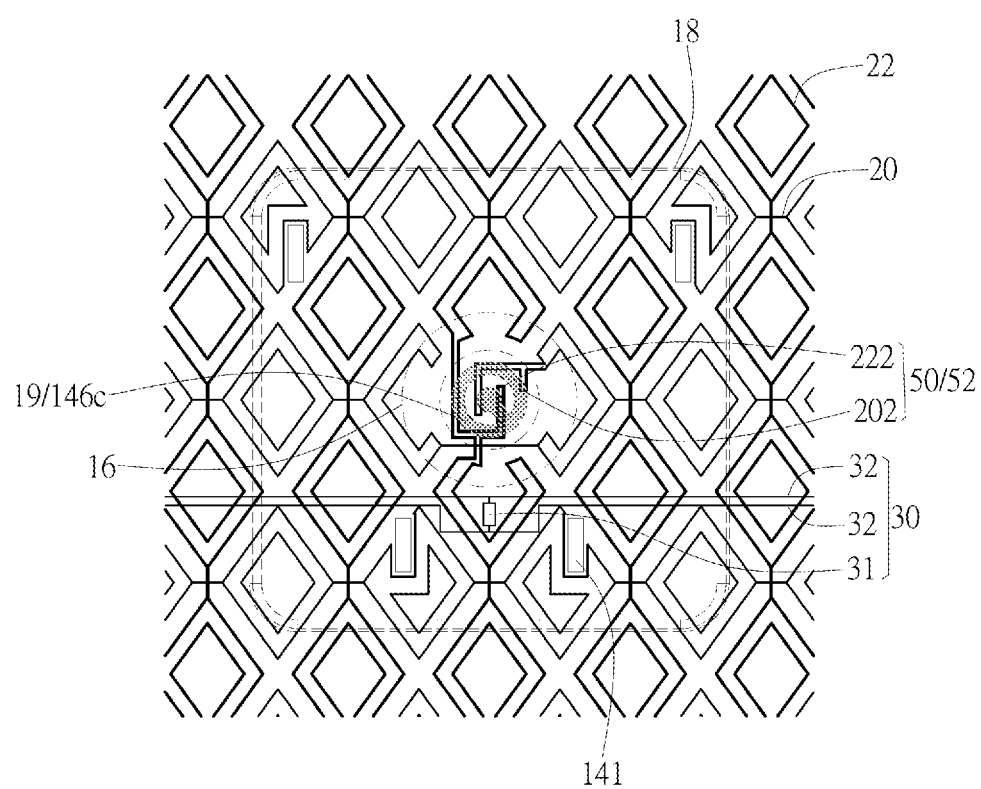
FIG. 13 is a schematic view showing the relationship between the electrode layout and the conductive coupling portion corresponding to the single keyswitch in FIG. 11B.

In one embodiment, the plurality of first electrode strings 20 shown in FIG. 12A and the plurality of light source wirings 32 shown in FIG. 12C can be integrated into the same-layer circuit design as shown in FIG. 12D. The combination of the plurality of first electrode strings 20 and the light source wirings shown in FIG. 12D and the plurality of second electrode strings 22 shown in FIG. 12B can be (1) integrated on the same surface of the same substrate in a manner similar to that shown in FIG. 5A, and the contact portions (e.g. 202, 222) thereof can be conducted by the conductive portion of the keyswitch components (which functions as the conductive coupling portion) outside the keyboard composite electrode module; or (2) integrated on the same surface of the same substrate (i.e., the first substrate 142') in a manner similar to that shown in FIGS. 7A to 7C, and the contact portions (e.g. 202, 222) thereof can be conducted by the conductive portion (e.g. conductive coupling portion 146c) disposed on the second substrate 146' through the through hole 144c of the spacer layer 144'. In other words, in the schematic view of FIG. 13, which shows the relationship between the electrode layout and the conductive coupling portion corresponding to the single keyswitch, when the keyboard composite electrode module is formed in the configuration (1), the conductive coupling portion (e.g. 19) is the conductive portion disposed on the keyswitch component (e.g. the restoring member 16). When the keyboard composite electrode module is formed in the configuration (2), the conductive coupling portion (e.g. 146c) is formed on another substrate (e.g. the second substrate 146'). In addition, by modifying the design of the first contact portion 202 and the second contact portion 222, the combination of the plurality of first electrode strings 20 and the light source circuit 32 similar to that shown in FIG. 12D and the plurality of second electrode strings 22 similar to that shown in FIG. 12B can be (3) respectively disposed on different substrates of the bearing structure in a manner similar to that shown in FIGS. 9A to 9C, and the switch unit can be triggered as the contact portions (e.g. 202, 222) come in contact with each other through the through hole 144c of the spacer layer 144'. The details of the above configurations (1), (2), and (3), can be referred to the related descriptions of the above embodiments, and will not be elaborated.

Furthermore, in the above embodiments, the plurality of first electrode strings 20 and the plurality of light source circuits 30 can be integrated into a circuit design formed on the same surface of the same substrate or formed on different surfaces of different substrates, but not limited thereto. In other embodiments (not shown), the touch sensing circuit 40 (i.e., the plurality of first electrode strings 20 and the plurality of second electrode strings 22) and the light source circuit 30 can be respectively disposed on opposite surfaces of a substrate. For example, the touch sensing circuit 40 (e.g. the plurality of first electrode strings 20 and the plurality of second electrode strings 22) is located on the upper surface of the substrate, and the light source circuit 30 can be located on the lower surface of the substrate. The light provided by the light sources 31 can emit through the light-transparent portion of the substrate (for example, 24a, 26a when the hollow electrode design is adopted or a portion of the substrate where the electrodes are not disposed) toward the keycaps 13 by means of the hollow electrode design.

It can be understood from the above various embodiments that the keyboard composite electrode module of the invention includes a plurality of electrode matrices M and a light source circuit 30. The plurality of electrode matrices M are consecutively arranged along the first direction L and the second direction W. Two of the electrode matrices (such as Ma, Mb) adjacent in the second direction W are shifted from and mis-aligned with each other along the second direction W. At least two of the electrode matrices (such as Ma, Mb) mis-aligned in the second direction are identical to each other. Each of the electrode matrices M includes a plurality of sections of the first electrode strings (e.g. 20a~c, 20d~f, 20g~i) and a plurality of sections of the second electrode strings (e.g. 22a~d, 22e~h, 22i~l) interlaced with the plurality of sections of the first electrode strings. The light source circuit 30 includes a plurality of light source wirings 32 and a plurality of light sources 31 disposed on the plurality of light source wirings 32. The plurality of light sources 31 are disposed in the plurality of electrode matrices M in a one-to-one manner, and the position of each light source 31 in the corresponding electrode matrix M is correspondingly the same. In the embodiments of the invention, the luminous touch keyboard and its keyboard composite electrode module integrate the light source circuit (and the switch circuit), and each of the key projection zones can cover the same electrode pattern including the light source, thus reducing the complexity of electrode layout design, improving the regularity of electrode sensing performance, and in turn improving the accuracy of touch operation of the luminous touch keyboard. In one embodiment, the luminous touch keyboard 10 can control the electrical state of the keyboard composite electrode module 14 by a control module. The control module may include a keyboard processing unit and a sensing processing unit. The keyboard processing unit is electrically connected to the switch circuit (such as the first contact portions and the second contact portions) of the keyboard composite electrode module 14 to sense the state of the switch units. The sensing processing unit is electrically connected to the touch sensing circuit of the keyboard composite electrode module 14 to sense the capacitance value of the electrodes. The control module outputs the sensing result through an interface, such as outputting the alphanumeric input of the corresponding keyswitch structure or the touch position in the touch area 120.

Although the preferred embodiments of the invention have been described herein, the above description is merely illustrative. The preferred embodiments disclosed will not limit the scope of the invention. Further modification of the invention herein disclosed will occur to those skilled in the respective arts and all such modifications are deemed to be within the scope of the invention as defined by the appended claims.

What is claimed is:

1. A keyboard composite electrode module, comprising:
    a bearing structure;
    a light source circuit disposed on the bearing structure, the light source circuit comprising a plurality of light sources; and
    a touch sensing circuit disposed on the bearing structure, the touch sensing circuit comprising:
    a plurality of first electrode strings extending along a first direction and arranged at intervals in a second direction; and
    a plurality of second electrode strings extending along the second direction and arranged at intervals in the first direction to be interlaced with the plurality of first electrode strings,
    wherein a plurality of key projection zones are defined on the keyboard composite electrode module, each of the key projection zones covers a same key-face electrode pattern, each of the key-face electrode patterns comprises one of the plurality of light sources, and a position of the light source in each of the key-face electrode patterns is correspondingly the same.

2. The keyboard composite electrode module of claim 1, wherein the plurality of first electrode strings and the plurality of second electrode strings are interlaced to form a plurality of electrode matrices arranged along the first direction and the second direction, two of the electrode matrices adjacent in the second direction are mis-aligned, each of the electrode matrices corresponds to one of the plurality of key projection zones, and in each of the key projection zones, the position of the light source in the electrode matrix is correspondingly the same.

3. The keyboard composite electrode module of claim 2, wherein a plurality of key-gap projections are defined on the plurality of electrode matrices, corresponding to each of the plurality of key projection zones, the key-gap projection surrounds the corresponding key projection zone, and each of the key-gap projection covers a same key-gap electrode pattern.

4. The keyboard composite electrode module of claim 1, wherein the light source circuit comprises a plurality of light source wirings for electrically coupling to the plurality of light sources, and the plurality of light source wirings extend along the first direction and are arranged at intervals in the second direction, such that the plurality of light source wirings are arranged at intervals with the plurality of first electrode strings and interlaced with the plurality of second electrode strings.

5. The keyboard composite electrode module of claim 4, wherein the bearing structure comprises a first substrate; the light source circuit, the plurality of first electrode strings, and the plurality of second electrode strings are disposed on a same surface of the first substrate, and at locations where the second electrode strings are interlaced with the light source circuit and the plurality of first electrode strings, an insulation layer is disposed between the plurality of second electrode strings and the light source circuit and between the plurality of second electrode strings and the plurality of first electrode strings.

6. The keyboard composite electrode module of claim 5, wherein at the locations where the second electrode strings are interlaced with the light source circuit and the plurality of first electrode strings, the light source circuit or the plurality of first electrode strings are located between the plurality of second electrode strings and the first substrate.

7. The keyboard composite electrode module of claim 5, wherein the key-face electrode pattern further comprises a first contact portion and a second contact portion, wherein the first contact portion and the second contact portion extend respectively from one of the first electrode strings and one of the second electrode strings; the first contact portion and the second contact portion are conducted via a conductive coupling portion.

8. The keyboard composite electrode module of claim 7, wherein the bearing structure further comprises a second substrate disposed opposite to the first substrate and a spacer layer sandwiched between the first substrate and the second substrate; the key-face electrode pattern comprises the conductive coupling portion; the conductive coupling portion is formed on the second substrate; the spacer layer has a through hole; the first contact portion and the second contact portion are disposed corresponding to the through hole and opposite to the conductive coupling portion; a portion of the keyboard composite electrode module corresponding to the first contact portion and the second contact portion is pressable, such that the conductive coupling portion electrically couples to the first contact portion and the second contact portion via the through hole when the portion is pressed.

9. The keyboard composite electrode module of claim 7, wherein the conductive coupling portion comprises a contact surface; the first contact portion and the second contact portion respectively comprises at least a contact line; the first contact portion and the second contact portion are electrically connected to each other when the contact surface comes in contact with the contact lines.

10. The keyboard composite electrode module of claim 4, wherein the bearing structure comprises a first substrate, a second substrate deposed opposite to the first substrate, and a spacer layer sandwiched between the first substrate and the second substrate; the plurality of first electrode strings and the light source circuit are formed on a first upper surface of the first substrate, and the plurality of second electrode strings are formed on a lower surface of the second substrate.

11. The keyboard composite electrode module of claim 10, wherein the key-face electrode pattern further comprises a first contact portion and a second contact portion, wherein the first contact portion and the second contact portion respectively extend from one of the first electrode strings and one of the second electrode strings; the spacer layer has a through hole; the first contact portion and the second contact portion are disposed opposite to each other with respect to the through hole; a portion of the keyboard composite electrode module corresponding to the first contact portion and the second contact portion is pressable, such that the first contact portion and the second contact portion come in contact with each other via the through hole when the portion is pressed.

12. The keyboard composite electrode module of claim 11, wherein the first contact portion and the second contact portion respectively comprises at least a contact line; the first contact portion and the second contact portion are electrically connected to each other when the contact lines come in contact with each other.

13. The keyboard composite electrode module of claim 12, wherein the contact line is a straight line, a curve, a loop, a rectangle, a serration, or any combination thereof.

14. The keyboard composite electrode module of claim 4, wherein the bearing structure comprises a substrate; the light source circuit and the touch sensing circuit are disposed on opposite surfaces of the substrate, and light provided by the plurality of light sources emit through the substrate from a portion of the substrate where the plurality of first electrode strings and the plurality of second electrode strings are not disposed.

15. The keyboard composite electrode module of claim 1, wherein each of the first electrode strings comprises a plurality of first main sections and a plurality of first branch sections; the plurality of main sections extend along the first direction and are linearly connected in series; the plurality of first branch sections are arranged at intervals in the first direction and protrude from the plurality of first main sections along the second direction.

16. The keyboard composite electrode module of claim 1, wherein each of the second electrode strings comprises a plurality of second main sections and a plurality of second branch sections; the plurality of second main sections extend separately along the second direction and are staggered and arranged in two rows in the first direction; the plurality of second branch sections are arranged at intervals along the second direction and connect the adjacent second main sections in the two rows along the first direction.

17. The keyboard composite electrode module of claim 1, wherein the key-face electrode pattern has a same layout of openings.

18. A keyboard composite electrode module, comprising:
a plurality of electrode matrices consecutively arranged along a first direction and a second direction, two of the electrode matrices adjacent in the second direction shifted from and mis-aligned with each other along the second direction, at least two of the electrode matrices mis-aligned in the second direction being identical to each other, each of the electrode matrices comprising:
a plurality of sections of first electrode strings; and
a plurality of sections of second electrode strings interlaced with the plurality of sections of first electrode strings; and
a light source circuit comprising a plurality of light source wirings and a plurality of light sources disposed on the plurality of light source wirings, the plurality of light sources disposed in the plurality of electrode matrices in a one-to-one manner, and a position of the light source in each of the electrode matrices is correspondingly the same.

19. A luminous touch keyboard, comprising:
a keyboard composite electrode module, comprising:
a plurality of electrode matrices; and
a light source circuit,
wherein the plurality of electrode matrices correspond to a plurality of key projection zones in a one-to-one manner; the plurality of electrode matrices are arranged along a first direction and a second direction; at least two of the electrode matrices are mis-aligned in the second direction and identical to each other; the electrode matrices comprise a plurality of electrodes arranged with a same electrode gap; a size of the electrode in the second direction is a function of a key pitch of the key projection zones, the electrode gap, and a number of rows or columns of the electrodes covered by the key pitch; the light source circuit comprises a plurality of light sources disposed in the plurality of electrode matrices in a one-to-one manner; a position of the light source in each of the electrode matrices is correspondingly the same.

\* \* \* \* \*